US012711590B2

(12) United States Patent
Soltani et al.

(10) Patent No.: US 12,711,590 B2
(45) Date of Patent: Aug. 18, 2026

(54) AUTOMATED CLASH DETECTION USING TWO-DIMENSIONAL DRAWINGS

(71) Applicant: Procore Technologies, Inc., Carpinteria, CA (US)

(72) Inventors: Mohammad Mostafa Soltani, Toronto (CA); Joshua Alexander Newland, Walnut Creek, CA (US); Jiazi Liu, North York (CA); Farid Mirahadi, North York (CA); David McCool, Carpinteria, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 124 days.

(21) Appl. No.: 18/427,523

(22) Filed: Jan. 30, 2024

(65) Prior Publication Data

US 2025/0245799 A1 Jul. 31, 2025

(51) Int. Cl.
*G06T 7/00* (2017.01)
*G06F 30/13* (2020.01)
(Continued)

(52) U.S. Cl.
CPC ............ *G06T 7/0002* (2013.01); *G06F 30/13* (2020.01); *G06F 30/27* (2020.01); *G06T 7/33* (2017.01);
(Continued)

(58) Field of Classification Search
CPC .... G06T 5/50; G06T 7/33; G06T 7/73; G06T 11/60; G06T 7/13; G06T 2200/24;
(Continued)

(56) References Cited

U.S. PATENT DOCUMENTS

2018/0247238 A1 8/2018 Hiraki et al.
2019/0318048 A1 10/2019 Kubicki et al.
(Continued)

FOREIGN PATENT DOCUMENTS

KR 10-2004-0079575 A 9/2004

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.
(Continued)

*Primary Examiner* — Xiao M Wu
*Assistant Examiner* — Scott E Sonners
(74) *Attorney, Agent, or Firm* — Lee Sullivan Shea & Smith LLP

(57) ABSTRACT

Techniques for performing an automated clash detection analysis on two-dimensional (2D) drawings associated with a given location of a construction project involve obtaining a set of 2D drawings for a construction project and identifying a subset of the 2D drawings that are associated with the given location of the construction project. From the subset of 2D drawings, a first 2D drawing and a second 2D drawing are selected for inclusion in the automated clash detection analysis. Based on respective sets of key points, the first and second 2D drawings are aligned and layered to produce an overlaid view. Objects in each 2D drawing are identified, and the overlaid view is analyzed to identify clashes between objects in the first 2D drawing and objects in the second 2D drawing. Respective visual representations of identified clashes may be displayed for user interaction.

21 Claims, 9 Drawing Sheets

(51) Int. Cl.

| | |
|---|---|
| ***G06F 30/27*** | (2020.01) |
| ***G06T 7/33*** | (2017.01) |
| ***G06T 7/73*** | (2017.01) |
| ***G06T 11/00*** | (2026.01) |
| ***G06V 30/422*** | (2022.01) |

(52) U.S. Cl.
CPC ................ *G06T 7/337* (2017.01); *G06T 7/74* (2017.01); *G06T 11/00* (2013.01); *G06V 30/422* (2022.01); *G06T 2200/24* (2013.01); *G06T 2207/20084* (2013.01); *G06T 2207/20092* (2013.01); *G06T 2210/04* (2013.01)

(58) Field of Classification Search
CPC ......... G06T 2207/20221; G06T 7/0014; G06T 7/001; G06T 7/30; G06T 7/12; G06T 7/10; G06T 7/0004; G06T 7/0002; G06T 7/97; G06T 7/337; G06T 7/55; G06T 11/206; G06T 11/00; G06T 3/14; G06T 7/60; G06T 7/344; G06T 7/32; G06T 7/174; G06T 2207/30184; G06T 2210/04; G06T 2207/20212; G06T 7/248; G06T 2207/20092; G06T 2219/2004; G06T 2207/20104; G06T 7/254; G06T 2207/20101; G06T 7/168; G06T 9/20; G06T 2207/20108; G06T 2210/21; G06T 2211/441; G06T 9/001; G06V 10/82; G06V 10/25; G06V 10/44; G06V 20/176; G06V 30/414; G06V 10/40
See application file for complete search history.

(56) References Cited

U.S. PATENT DOCUMENTS

| | | | | |
|---|---|---|---|---|
| 2021/0110618 | A1 | 4/2021 | Jalla | |
| 2022/0036525 | A1* | 2/2022 | Xin | G06V 10/772 |
| 2022/0343107 | A1* | 10/2022 | Wu | G06F 30/18 |
| 2022/0391627 | A1 | 12/2022 | Powles et al. | |
| 2023/0274384 | A1* | 8/2023 | Bleyer | H04N 13/156<br>382/284 |

OTHER PUBLICATIONS

International Searching Authority, PCT International Search Report and Written Opinion, PCT International Application No. PCT/US2025/013592 dated May 14, 2025, 9 pages.

* cited by examiner

500

OUTPUT
504
(DETECTED CLASHES)

TWO-DIMENSIONAL
DRAWING(S)

BACK-END COMPUTING PLATFORM 501

DRAWING ANALYSIS
SUBSYSTEM 505
DATA SCIENCE
MODEL(S)
DRAWING MATCHING
DRAWING MAPPING

CLASH DETECTION
SUBSYSTEM 506
DATA SCIENCE
MODEL(S)
DRAWING MAPPING
OBJECT
IDENTIFICATION

END-USER DEVICE
503

INPUT
502
(CLASH DETECTION
REQUEST)

702

FIRE SAFETY PLAN
REFLECTED CEILING PLAN
Conference Room 400
Conference Room 400
2D Clash Mode
Clashes Detected: 3
Previous Clash
Next Clash
700
CLASH 1
Ceiling Light 403
Architectural – RCP
Sprinkler 406
Fire Safety – FSP
ACTIONS
FIRE

700

FIRE SAFETY PLAN
REFLECTED CEILING PLAN
Conference Room 400
Conference Room 400

2D Clash Mode
Clashes Detected: 3
Previous Clash
Next Clash

CLASH 1
Ceiling Light 403
Architectural – RCP
Sprinkler 406
Fire Safety – FSP

ACTIONS
Resolve Clash
Assign Clash
Create RFI
Create Coordination Issue

FIRE

AUTOMATED CLASH DETECTION USING TWO-DIMENSIONAL DRAWINGS

BACKGROUND

Construction projects are complex undertakings that involve intensive planning, design, and implementation throughout several discrete construction phases. For instance, in a design phase, architects design the overall shape and layout of a construction project. Next, in a planning phase, engineers produce engineering drawings and plans based on the architects' designs that are to be used during construction. Further, the engineers may also design various portions of the construction project's infrastructure, such as an HVAC (heating, ventilation, and air conditioning) system, an MEP (mechanical, electrical, plumbing) system, a fire safety system, etc., and produce plans reflecting these designs as well. In a logistics phase, contractors may review the drawings and plans produced by the engineers and begin to allocate various resources for completing the construction project, including determining what materials to purchase, scheduling deliveries, hiring construction professionals for working on the construction project, and developing plans for carrying out the actual construction of the project. During a construction phase, the construction professionals begin actual construction of the project.

Certain phases of a construction project involve reviewing various construction project data to identify and resolve conflicts, such as conflicts in the designs and/or plans of the construction project. The process of identifying such conflicts can be time-consuming, cumbersome, and error-prone. Further, overlooked clashes can adversely impact aspects of the construction project, such as scheduling and budgeting. Thus, improvements in software technology for facilitating such endeavors is desirable.

Overview

During certain stages in a construction project's lifecycle, construction professionals typically engage in a rigorous review of construction project design information in order to resolve conflicts that may give rise to issues during construction. One such type of conflict is an object clash. An object clash occurs when two or more designed objects of a construction project occupy the same design space. For example, piping and ductwork may be designed for installation in a given location of a construction project such that the piping is inadvertently routed through the ductwork. As another example, a water sprinkler and a ceiling speaker may be designed for installation in a given location of a construction project such that the ceiling speaker is overlaid on the water sprinkler. Other examples are also possible. Ideally, such clashes are identified before commencement of actual construction through a process generally known as "clash detection" or "coordination."

In general, design information for a construction project is embodied in a visual representation (e.g., a set of drawings) that visually communicates information about the construction project, such as what the project is to look like and/or how the project is to be assembled or constructed. Such visual representations may take various forms.

For instance, as one possibility, a visual representation of a construction project may take the form of a two-dimensional ("2D") drawing, such as an architectural drawing, in which two-dimensional depictions in the drawing (e.g., line segments, objects, etc.) represent certain physical elements of the construction project, like walls, pipes, ducts, fixtures, etc. In this respect, a 2D drawing could be embodied either in physical form (e.g., printed on paper) or in computerized form, such as in an electronic file (e.g., a PDF, JPEG, etc.). 2D drawings are often set out in a universally recognized format that most, if not all, construction professionals can read and understand. Further, 2D drawings are designed to be relatively compact, with one drawing being arranged to fit on a single piece of paper or in a computerized file format that requires minimal processing power and computer storage to view (e.g., a PDF viewer, JPEG viewer, etc.).

Further yet, 2D drawings for a construction project may be categorized into various disciplines of 2D drawings that each depicts respective information for the construction project. For instance, a first discipline may comprise architectural drawings that depict technical information about the construction project, a second discipline may comprise structural drawings that depict information about structural aspects of the construction project, a third discipline may comprise electrical drawings that depict information about electrical connections, outlets, fixtures, switches, lighting, etc., for the construction project, a fourth discipline may comprise plumbing drawings that depict information about the piping system of the construction project, and a fifth discipline may comprise fire safety drawings that depict information about a fire prevention system for the construction project, among other possibilities. As a result, any given location of a construction project may have multiple types of corresponding 2D drawings that serve to convey different types of design and/or plan information for the given location.

As another possibility, a visual representation of a construction project may take the form of a three-dimensional (3D) model embodied in a computerized form, such as in a building information model (BIM) file. There are many ways for a BIM file to arrange and store data that describes attributes of individual physical elements of a construction project. In one specific example, a BIM file may contain data that represents each individual physical object in a construction project (e.g. each pipe, each duct, each wall, etc.) as a respective set of geometric triangles (e.g., a triangular irregular network, or TIN) such that when the geometric triangles are visually stitched together by BIM viewer software, the triangles form a mesh (e.g., a surface) that represents a scaled model of the individual physical object.

In this respect, the BIM file may contain data that represents each triangle of a given mesh as a set of coordinates in three-dimensional space ("3D-space"). For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). A given mesh may be comprised of thousands, tens of thousands, or even hundreds of thousands of individual triangles, where each triangle may have a respective set of three vertices and corresponding sets of 3D-space coordinates for those vertices. A BIM file may contain data that represents each individual physical object in a construction project in other ways as well.

Specialized BIM software is configured to access a BIM file and render a three-dimensional model of the construction project that is viewable from one or more perspectives. A 3D model may provide a more comprehensive overview of the construction project by conceptualizing information in a single 3D view that would otherwise be spread across multiple 2D drawings. In addition, BIM software allows a construction professional to navigate through a 3D model and view and/or interact with elements, such as a particular wall or duct.

3D models typically provide a comprehensive representation of information about a construction project and can thus be useful for identifying and/or viewing object clashes. However, the construction industry is still growing accustomed to using 3D models and has yet to standardize the use of 3D models for managing aspects of construction project planning such as clash detection. Therefore, many, if not most, construction professionals do not have access to 3D models of construction projects, thus limiting their capability to utilize 3D models in clash detection efforts. Moreover, even if they do have access to a 3D model, navigating and utilizing a 3D model for complex analyses such as clash detection can be intimidating for the average construction professional.

Before computerized 2D representations of construction projects became available, a "clash detection" or "coordination" analysis was performed manually using physical 2D drawings printed on translucent paper (e.g., vellum). The 2D drawings were then overlaid on a light table (e.g., a table with an illuminated glass surface) in stacked batches, such as three or four drawings at a time, such that a construction professional could see the contents of all of the drawings in a given batch simultaneously in order to visually identify object clashes between the drawings in the given batch. Any identified clashes would be manually noted (e.g., circled or highlighted on the drawing, etc.), and plans for the construction project would be revised in order to resolve the identified clashes. This "light table coordination" process would be repeated many times throughout several iterations as needed. Many construction professionals today prefer to utilize this method of overlaying 2D drawings for clash detection analysis. However, engaging in this process manually can be extremely tedious, inefficient, and error-prone given the large scale of many construction projects and the number of physical drawings that would need to be manually analyzed. Thus, it can be beneficial to be able to utilize computerized two-dimensional representations (e.g., 2D drawings) of a construction project for identifying object clashes.

To aid in this effort, there have been attempts to computerize some aspects of performing a clash detection analysis. For instance, existing technology enables computerized 2D drawings to be visually presented in a manner such that the contents of overlaid 2D drawings are visible simultaneously. Yet, limitations surrounding utilization of two-dimensional representations for clash detection analyses persist. For instance, even though such existing technology enables 2D drawings to be overlaid and presented electronically, construction professionals are still required to determine which drawings should be grouped for overlay, select those drawings, and then manually analyze the selected drawings in an overlaid view to identify any object clashes.

Thus, the construction industry in general has suffered from limitations in software technology and software tools for using two-dimensional representations of a construction project to perform clash detection analyses. To address such shortcomings, Procore Technologies, Inc. ("Procore") the Assignee of the present application, has been developing new software technology related to producing two-dimensional representations of construction projects that can be utilized for various purposes, including clash detection analyses. For instance, Procore has developed new software technology and techniques for generating a two-dimensional view from a three-dimensional model of a construction project and then enabling clash detection on objects within the generated two-dimensional view, more information about which can be found in U.S. patent application Ser. No. 18/365,186, filed Aug. 3, 2023, and titled "Generating Two-Dimensional Views for Two-Dimensional Clash Detection," the contents of which are incorporated by reference herein in their entirety.

Continuing its innovative efforts, Procore has developed new software technology, tools, and techniques for automated clash detection using two-dimensional drawings.

Accordingly, in one aspect, disclosed herein is a method for facilitating automated clash detection using 2D drawings that involves (i) obtaining a set of two-dimensional (2D) drawings for a construction project, (ii) from the set of 2D drawings, identifying a subset of 2D drawings that are associated with a given location of the construction project, (iii) identifying a first 2D drawing and a second 2D drawing from the subset of 2D drawings for inclusion in an automated clash detection analysis, (iv) based on comparing a first set of key points for the first 2D drawing and a second set of key points for the second 2D drawing, aligning the first and second 2D drawings and thereby produce an overlay of the first and second 2D drawings, (v) analyzing the first 2D drawing to identify a first set of objects depicted in the first 2D drawing, (vi) analyzing the second 2D drawing to identify a second set of objects depicted in the second 2D drawing, and (vii) based on analyzing the first and second 2D drawings, identifying an object clash between a first object in the first set of objects and a second object in the second set of objects.

In another aspect, disclosed herein is a computing platform that includes a network interface, at least one processor, at least one non-transitory computer-readable medium, and program instructions stored on the at least one non-transitory computer-readable medium that are executable by the at least one processor to cause the computing platform to carry out one or more of the functions disclosed herein, including but not limited to the functions of the foregoing method.

In yet another aspect, disclosed herein is a non-transitory computer-readable storage medium that is provisioned with program instructions that, when executed by at least one processor, cause a computing platform to carry out one or more of the functions disclosed herein, including but not limited to the functions of the foregoing method.

One of ordinary skill in the art will appreciate these as well as numerous other aspects in reading the following disclosure.

Figure 1:
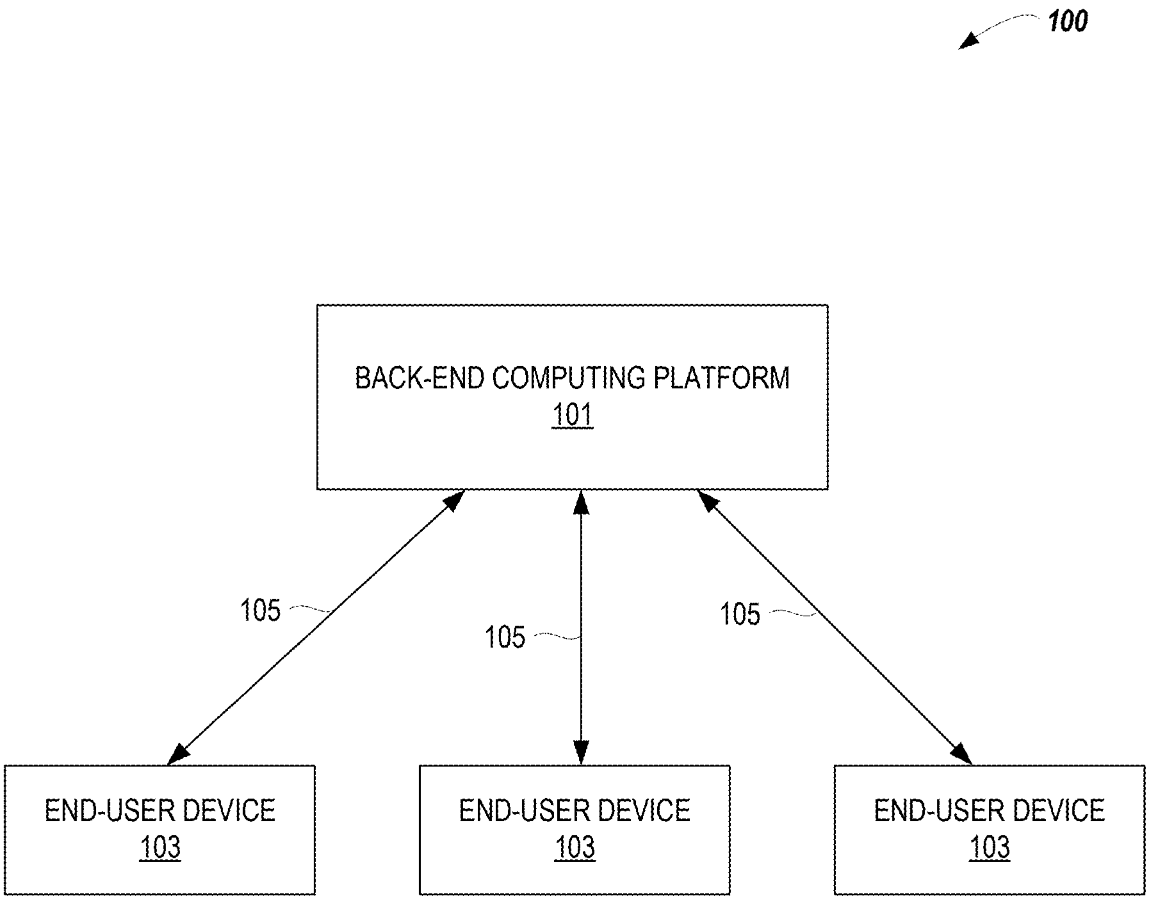
FIG. 1 depicts an example computing environment in which example embodiments may be implemented.

Features, aspects, and advantages of the presently disclosed technology may be better understood with regard to the following description, appended claims, and accompanying drawings, as listed below. The drawings are for the purpose of illustrating example embodiments, but those of ordinary skill in the art will understand that the technology disclosed herein is not limited to the arrangements and/or instrumentality shown in the drawings.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

The present disclosure is generally directed to new software technology that enables automated clash detection on objects in two-dimensional drawings. In some implementations, the disclosed software technology may function to facilitate user action with respect to an identified clash. Further, in some implementations, the disclosed software technology may function to determine and/or display possible resolutions for identified clashes.

The disclosed software technology may be incorporated into one or more software applications that may take any of various forms. As one possible implementation, this software technology may be incorporated into a software as a service ("SaaS") application that includes both front-end software running on one or more end-user devices that are accessible to individuals associated with construction projects (e.g., contractors, subcontractors, project managers, architects, engineers, designers, etc., each of which may be referred to generally herein as a "construction professional") and back-end software running on a back-end computing platform (sometimes referred to as a "cloud" platform) that interacts with and/or drives the front-end software, and which may be operated (either directly or indirectly) by the provider of the front-end software. As another possible implementation, this software technology may be incorporated into a software application that takes the form of front-end client software running on one or more end-user devices without interaction with a back-end computing platform. The software technology disclosed herein may be incorporated into a software application that takes other forms as well. Further, such front-end client software may take various forms, examples of which may include a mobile application, a web application, and/or a hybrid application, among other possibilities.

Turning now to the figures, FIG. 1 depicts an example computing environment 100 in which example embodiments of the present disclosure may be implemented. As shown in FIG. 1, the computing environment 100 includes a back-end computing platform 101 that may be communicatively coupled to one or more end-user devices, depicted here, for the sake of discussion, as end-user devices 103.

The back-end computing platform 101 may comprise any one or more computer systems (e.g., one or more servers) that have been installed with software for carrying out the back-end computing platform functionality disclosed herein. In practice, the one or more computer systems of the back-end computing platform 101 may generally comprise some set of physical computing resources (e.g., processors, data storage, communication interfaces, etc.), which may take any of various forms.

As one possibility, the back-end computing platform 101 may comprise cloud computing resources that are supplied by a third-party provider of "on demand" cloud computing resources, such as Amazon Web Services (AWS), Amazon Lambda, Google Cloud Platform (GCP), Microsoft Azure, or the like. As another possibility, the back-end computing platform 101 may comprise "on-premises" computing resources of the organization that operates the back-end computing platform 101 (e.g., organization-owned servers). As yet another possibility, the back-end computing platform 101 may comprise a combination of cloud computing resources and on-premises computing resources.

Further, in practice, software on the back-end computing platform 101 may be implemented using any of various software architecture styles, examples of which may include a microservices architecture, a service-oriented architecture, and/or a serverless architecture, among other possibilities, as well as any of various deployment patterns, examples of which may include a container-based deployment pattern, a virtual-machine-based deployment pattern, and/or a Lambda-function-based deployment pattern, among other possibilities.

As shown in FIG. 1, each end-user device 103 may be configured to communicate with the back-end computing platform 101 over a respective communication path 105. Each respective communication path 105 may generally comprise one or more data networks and/or data links, which may take any of various forms. For instance, each respective communication path 105 may include any one or more of a personal area network (PAN), a local area network (LAN), a wide area network (WAN) such as the Internet and/or a cellular network, a cloud network, and/or a point-to-point data link, among other possibilities, where each such data network and/or link may be wireless, wired, or some combination thereof, and may carry data according to any of various different communication protocols. Additionally, at least some aspects of the communication between an end-user device 103 and the back-end computing platform 101 may be carried out via an Application Programming Interface (API) provided by the back-end computing platform 101, among other possibilities. Although not shown, the respective communication paths 105 may also include one or more intermediate systems, examples of which may include a data aggregation system and host server, among other possibilities. Many other configurations are also possible.

It should be understood that the computing environment 100 is one example of a computing environment in which the disclosed software technology may be implemented, and that numerous other examples of computing environments are possible as well-including but not limited to the possibility that the computing environment 100 may include additional devices, systems, and/or platforms that could be involved in the disclosed functionality, among other examples.

The end-user devices 103 may each be any end-user device that is capable of carrying out the end-user device functionality disclosed herein. In this respect, each end-user device 103 may include hardware components such as one or more processors, data storage, one or more communication interfaces, and one or more input/output interfaces, among other possible hardware components, as well as software components that facilitate the end-user device's ability to run the front-end software incorporating the features disclosed herein (e.g., operating system software, web browser software, mobile application software, etc.). Each end-user device 103 may take any of various forms, examples of which may include a smartphone, a tablet, a desktop computer, a laptop computer, a netbook, and/or a personal digital assistant (PDA), among other possibilities.

As further depicted in FIG. 1, the back-end computing platform 101 may be configured to interact with the end-user devices 103 over respective communication paths 105. In this respect, each respective communication path 105 between the back-end computing platform 101 and an end-user device 103 may generally comprise one or more communication networks and/or communications links, which may take any of various forms. For instance, each respective communication path 105 with the back-end computing platform 101 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 105 with the back-end computing platform 101 may be wireless, wired, or some combination thereof, and may carry data according to any of various different communication protocols. Although not shown, the respective communication paths 105 between the end-user devices 103 and the back-end computing platform 101 may also include one or more intermediate systems. For example, it is possible that the back-end computing platform 101 may communicate with a given end-user device 103 via one or more intermediary systems, such as a host server (not shown). Many other configurations are also possible.

While FIG. 1 shows an arrangement in which three particular end-user devices 103 are communicatively coupled to the back-end computing platform 101, it should be understood that this is merely for purposes of illustration and that any number of end-user devices 103 may communicate with the back-end computing platform 101.

Although not shown in FIG. 1, the back-end computing platform 101 may also be configured to receive data, such as data related to a construction project, from one or more external data sources, such as an external database and/or another back-end computing platform or platforms. Such data sources—and the data output by such data sources—may take various forms.

It should be understood that the computing environment 100 is one example of a computing environment in which embodiments described herein may be implemented. Numerous other arrangements are possible and contemplated herein. For instance, other computing environments may include additional components not pictured and/or more or less of the pictured components.

Figure 2:
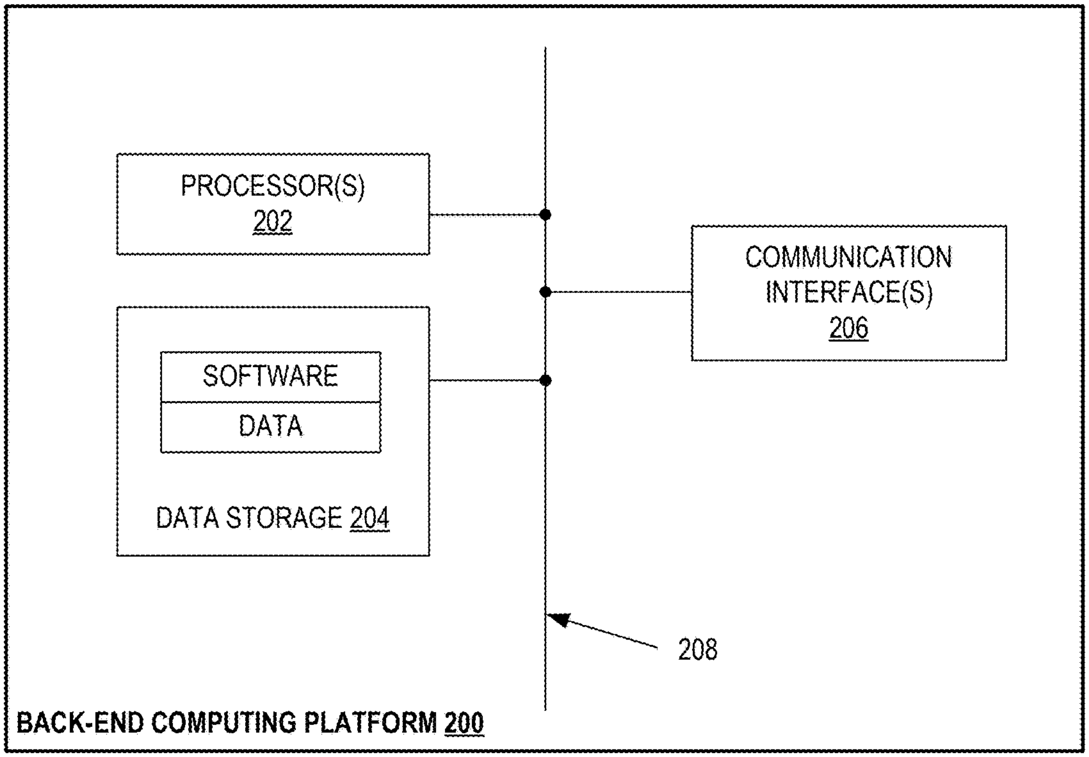
FIG. 2 depicts a structural diagram of an example computing platform that may be configured to carry out one or more of the functions according to the disclosed software technology.

Turning now to FIG. 2, a simplified block diagram is provided to illustrate some structural components that may be included in an example back-end computing platform 200 that may be configured to carry out any of the various back-end platform functions disclosed herein. At a high level, the example back-end computing platform 200 may generally comprise any one or more computing systems that collectively include one or more processors 202, data storage 204, and one or more communication interfaces 206, all of which may be communicatively linked by a communication link 208 that may take the form of a system bus, a communication network such as a public, private, or hybrid cloud, or some other connection mechanism. Each of these components may take various forms.

The one or more processors 202 may each comprise one or more processing components, such as general-purpose processors (e.g., a single- or a multi-core central processing unit (CPU)), special-purpose processors (e.g., a graphics processing unit (GPU), application-specific integrated circuit, or digital-signal processor), programmable logic devices (e.g., a field programmable gate array), controllers (e.g., microcontrollers), and/or any other processor components now known or later developed. It should also be understood that the one or more processors 202 could comprise processing components that are distributed across a plurality of physical computing systems connected via a network.

In turn, the data storage 204 may comprise one or more non-transitory computer-readable storage mediums that are collectively configured to store (i) program instructions that are executable by one or more processors 202 such that the back-end computing platform 200 is configured to perform any of the various functions disclosed herein, including but not limited to any of the back-end-platform functions disclosed herein, and (ii) data that may be received, derived, or otherwise stored, for example, in one or more databases, file systems, repositories, or the like, by the back-end computing platform 200, in connection with performing any of the various back-end platform functions disclosed herein. In this respect, the one or more non-transitory computer-readable storage mediums of the data storage 204 may take various forms, examples of which may include volatile storage mediums such as random-access memory, registers, cache, etc. and non-volatile storage mediums such as read-only memory, a hard-disk drive, a solid-state drive, flash memory, an optical-storage device, etc. It should also be understood that the data storage 204 may comprise computer-readable storage mediums that are distributed across a plurality of physical computing systems connected via a network.

The one or more communication interfaces 206 may be configured to facilitate wireless and/or wired communication with other systems and/or devices. Additionally, in an implementation where the back-end computing platform 200 comprises a plurality of physical computing systems connected via a network, the one or more communication interfaces 206 may be configured to facilitate wireless and/or wired communication between these physical computing systems (e.g., between computing and storage clusters in a cloud network). As such, the one or more communication interfaces 206 may each take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for any of various types of wireless communication (e.g., Wi-Fi communication, cellular communication, short-range wireless protocols, etc.) and/or wired communication. Other configurations are possible as well.

Although not shown, the back-end computing platform 200 may additionally include or have an interface for connecting to one or more user-interface components that facilitate user interaction with the back-end computing platform 200, such as a keyboard, a mouse, a trackpad, a display screen, a touch-sensitive interface, a stylus, a virtual-reality headset, and/or one or more speaker components, among other possibilities.

It should be understood that the back-end computing platform 200 is one example of a computing platform that may be used with the embodiments described herein. Numerous other arrangements are possible and contemplated herein. For instance, in other embodiments, the back-end computing platform 200 may include additional components not pictured and/or more or fewer of the pictured components.

Figure 3:
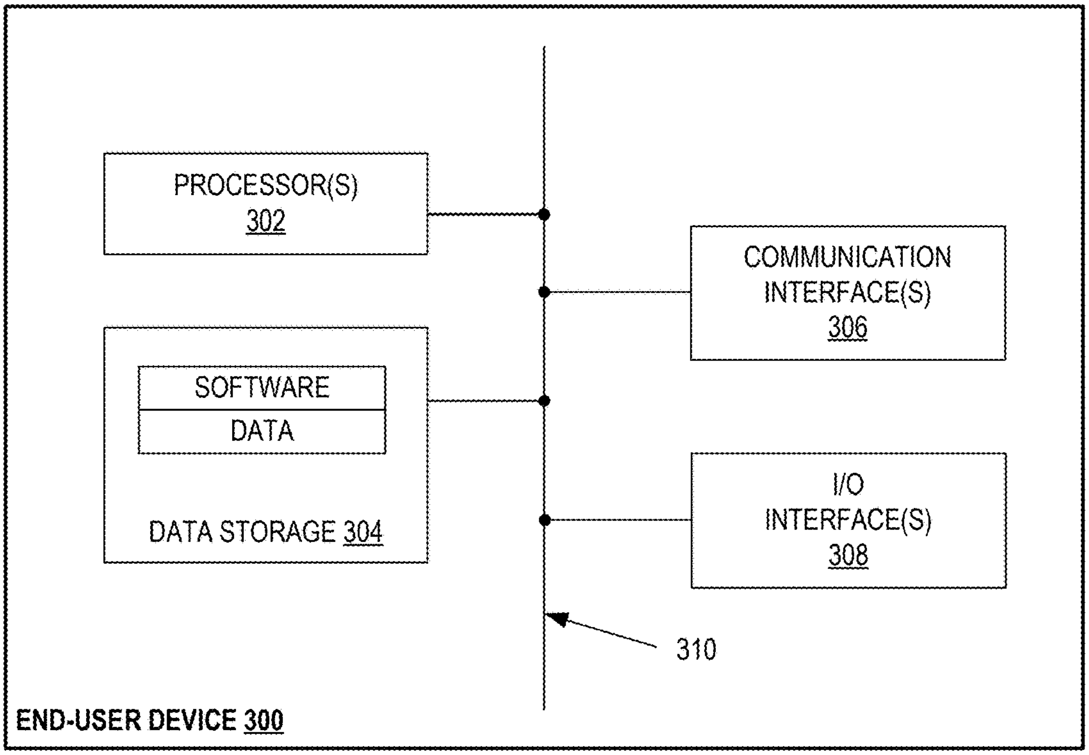
FIG. 3 depicts a structural diagram of an example end-user device that may be configured to communicate with the example computing platform of FIG. 2 and also carry out one or more functions in accordance with aspects of the disclosed technology.

Turning next to FIG. 3, a simplified block diagram is provided to illustrate some structural components that may be included in an example end-user device 300 that may be configured to carry out any of the various functions disclosed herein, including but not limited to any of the various end-user device functions disclosed herein. As shown in FIG. 3, the end-user device 300 may include one or more processors 302, data storage 304, one or more communication interfaces 306, and one or more input/output (I/O) interfaces 308, all of which may be communicatively linked by a communication link 310 that may take the form of a system bus or some other connection mechanism. Each of these components may take various forms.

The one or more processors 302 may comprise one or more processing components, such as general-purpose processors (e.g., a single- or a multi-core CPU), special-purpose processors (e.g., a GPU, application-specific integrated circuit, or digital-signal processor), programmable logic devices (e.g., a field programmable gate array), controllers (e.g., microcontrollers), and/or any other processor components now known or later developed.

In turn, the data storage 304 may comprise one or more non-transitory computer-readable storage mediums that are collectively configured to store (i) program instructions that are executable by the processor(s) 302 such that the end-user device 300 is configured to perform any of the end-user device functions disclosed herein, and (ii) data that may be received, derived, or otherwise stored, for example, in one or more databases, file systems, repositories, or the like, by the end-user device 300. In this respect, the one or more non-transitory computer-readable storage mediums of the data storage 304 may take various forms, examples of which may include volatile storage mediums such as random-access memory, registers, cache, etc. and non-volatile storage mediums such as read-only memory, a hard-disk drive, a solid-state drive, flash memory, an optical-storage device, etc. The data storage 304 may take other forms and/or store data in other manners as well.

The one or more communication interfaces 306 may be configured to facilitate wireless and/or wired communication with other computing devices. The communication interface(s) 306 may take any of various forms suitable to provide for any of various types of wireless communication (e.g., Wi-Fi communication, cellular communication, short-range wireless protocols, etc.) and/or wired communication. Other configurations are possible as well.

The end-user device 300 may additionally include or have interfaces for one or more I/O interfaces 308 that can be used to facilitate user interaction with the end-user device 300, such as a keyboard, a mouse, a trackpad, a display screen, a touch-sensitive interface, a stylus, a virtual-reality headset, and/or one or more speaker components, among other possibilities.

It should be understood that the end-user device 300 is one example of an end-user device that may be used to interact with an example computing platform as described herein. Numerous other arrangements are possible and contemplated herein. For instance, in other embodiments, the end-user device 300 may include additional components not pictured and/or more or fewer of the pictured components.

I. Object Clashes in 2D Drawings

As mentioned above, existing software technology and tools related to two-dimensional representations of construction projects, even while providing capability for viewing or overlaying electronic 2D drawings for the purpose of performing manual clash detection analysis, do not provide for automated clash detection analysis. To illustrate, consider the example shown in FIGS. 4A-4C.

Figure 4A:
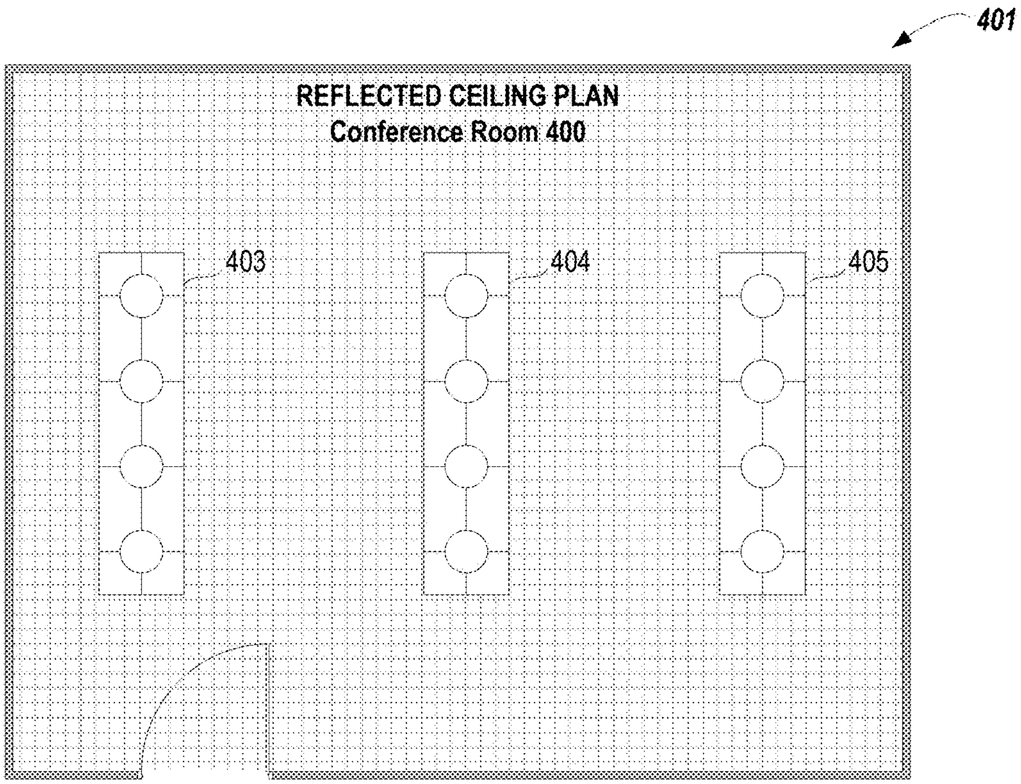
FIG. 4A depicts a portion of a first example electronic two-dimensional drawing associated with a given location of a construction project.
Figure 4B:
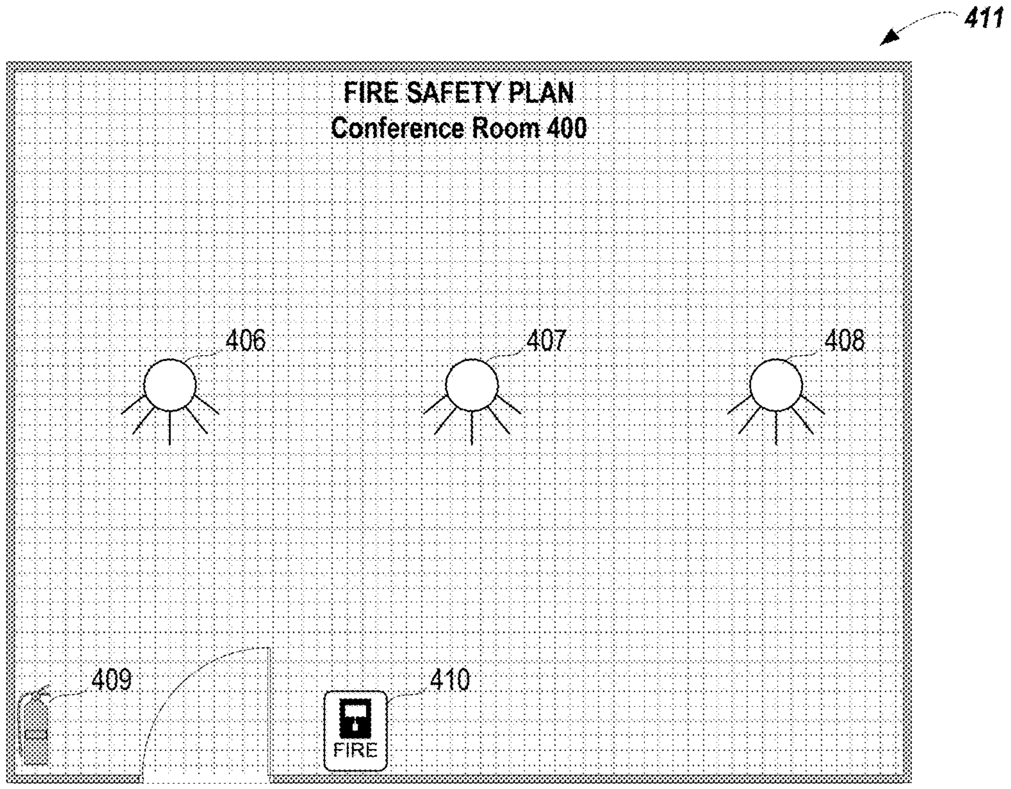
FIG. 4B depicts a portion of a second example electronic two-dimensional drawing associated with the given location of the construction project depicted in FIG. 4A.

FIG. 4A depicts a portion of a first example electronic 2D drawing—namely, an architectural drawing comprising a reflected ceiling plan (RCP) 401—that depicts objects that will be installed on a ceiling of a given location. For instance, as shown in FIG. 4A, the RCP 401 may indicate ceiling lights 403, 404, and 405 located on the ceiling of a conference room 400. FIG. 4B depicts a portion of a second example electronic 2D drawing—namely, a fire safety plan (FSP) 411—that depicts visible fire safety objects located on the ceiling and/or walls of the conference room 400. As shown in FIG. 4B, the FSP 411 may indicate sprinklers 406, 407, and 408 located on the ceiling of the conference room 400, a fire extinguisher 409 located on a first wall of the conference room 400, and a fire alarm 410 located on a second wall of the conference room 400. It should be understood that while only those portions of the RCP 401 and the FSP 411 corresponding to the conference room 400 are depicted in FIGS. 4A and 4B for simplicity, in practice, the RCP 401 and the FSP 411 may depict objects for additional locations as well, such as other rooms and/or locations (e.g., hallways, staircases, etc.) located on the same wing and/or floor as the conference room 400. In this respect, the RCP 401 and the FSP 411 may each depict a large number (e.g., dozens or even hundreds) of objects that are to be installed on the ceilings and/or walls of the various locations.

In line with the discussion above, a construction professional may wish to engage in a clash detection analysis in order to determine whether plans (e.g., drawings) for the conference room 400 present any object clashes that should be resolved prior to commencement of construction. In accordance with existing technology, the construction professional may elect to compare two or more drawings for the conference room 400. For instance, the construction professional may compare the RCP 401 and the FSP 411 to determine if any object clashes between those drawings exist. However, as noted above, limitations in existing technology present several challenges. For instance, as an initial matter, the construction professional may not be aware of all of the various different disciplines of drawings that exist for a given location, which may lead to certain disciplines being excluded from the clash detection analysis (e.g., by virtue of not being selected for comparison by the construction professional). Even if the construction professional is aware of all of the different drawing disciplines that may be available for comparison, the construction professional is typically required to identify each discipline and then select desired drawings from the identified discipline that are to be overlaid for comparison. Further, the construction professional may additionally be required to manually adjust the electronic drawings that have been selected for comparison in order to align them for comparison. For instance, the construction professional may need to electronically rotate one or more of the selected drawings such that the selected drawings are aligned when overlaid.

Figure 4C:
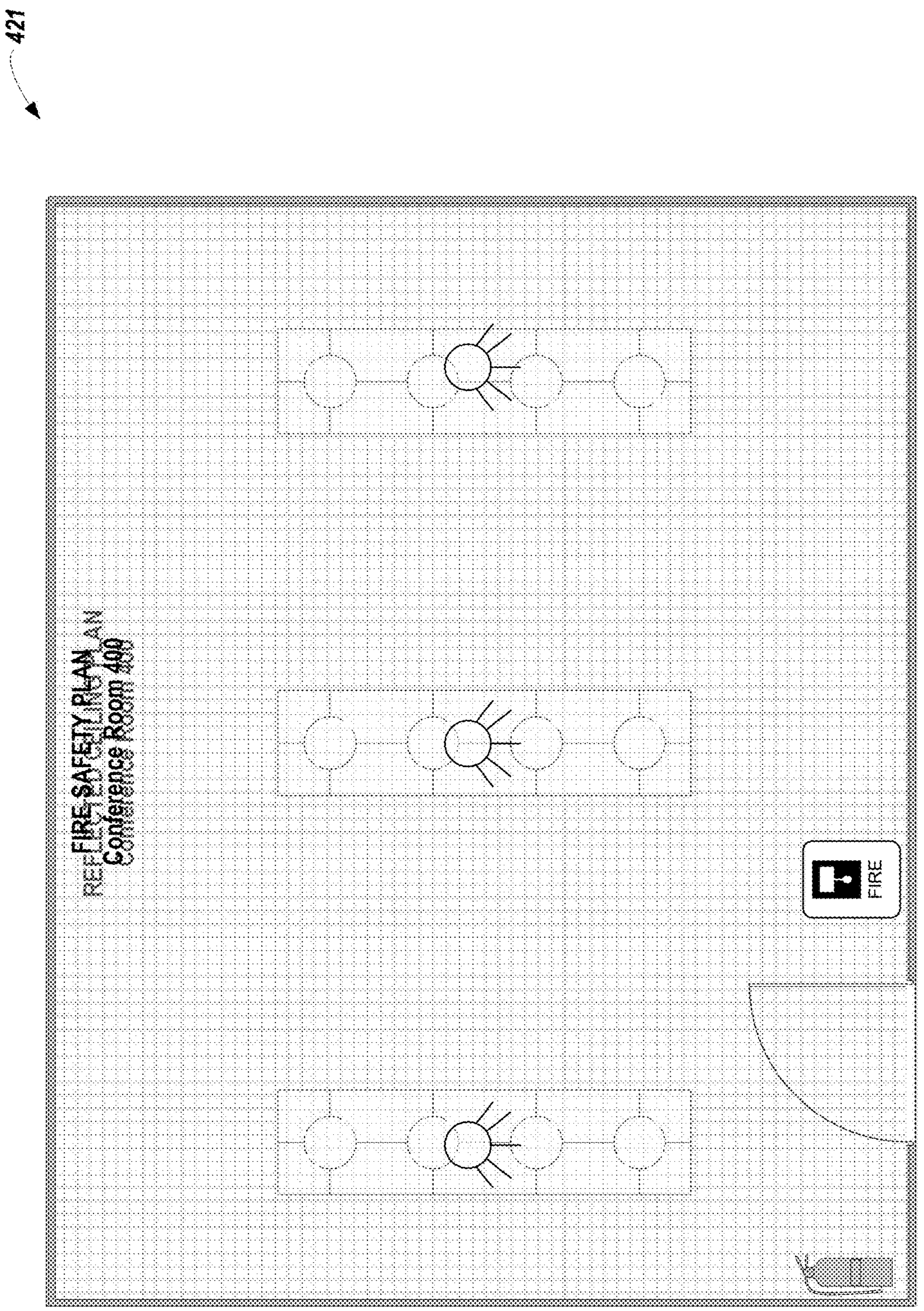
FIG. 4C depicts an example overlay of the portions of the example drawings depicted in FIGS. 4A and 4B.

Moreover, after selecting the drawings for comparison, the construction professional is then required to manually analyze the overlaid drawings in order to identify any object clashes. For instance, after selecting the RCP 401 and FSP 411 for comparison, the construction professional may be presented with a view similar to the view 421 shown in FIG. 4C, wherein the FSP 411 is overlaid on the RCP 401. The construction professional must then manually review the view 421 to identify any object clashes between the RCP 401 and the FSP 411. For instance, as shown in FIG. 4C, the construction professional may identify a first clash between the ceiling light 403 and the sprinkler 406, a second clash between the ceiling light 404 and the sprinkler 407, and a third clash between the ceiling light 405 and the sprinkler 408. However, as noted above, the example portions of the RCP 401 and the FSP 411 that are depicted in FIGS. 4A-4C have been simplified for purposes of illustration, and in practice, the RCP 401 and the FSP 411 would depict objects for many other locations, thereby requiring the construction professional to carefully review each portion of the overlaid view of the RCP 401 and the FSP 411 in order to identify object clashes.

As can be expected, manually analyzing electronic 2D drawings in the manner described above in order to identify object clashes is not only tedious and cumbersome, but prone to human error. For instance, in practice, the construction professional may fail to initially identify one or more relevant disciplines and/or drawings corresponding to a given location, thereby excluding one or more drawings in the clash detection analysis. Further, the construction professional may fail to properly align the overlay of the selected drawings, thereby skewing the results of the manual clash detection analysis. Further yet, the construction professional may fail to identify certain clashes during manual analysis of the overlaid drawings.

Failure to detect such clashes could have detrimental impacts on the progress of a construction project. For instance, if any of the clashes between the ceiling lights 403-405 and the sprinklers 406-408 was not detected during the planning/design phase(s), the clash may not be discovered until after construction commences, at which point adjusting the installation location for one or both of the ceiling lights 403-405 or the sprinklers 406-408 may prove difficult and/or costly. For example, at the time the conflict is discovered, it may be determined that the sprinklers 406-408 cannot be repositioned without considerable effort and cost because a water supply system to which the sprinklers 406-408 are to be connected has already been installed. Thus, it may be determined that the best solution for resolving the clash would be to reposition the installation location of the ceiling lights 403-405. However, repositioning the ceiling lights 403-405 may also prove challenging.

For instance, it may further be determined that the ceiling of the conference room 400 has already been prepared for installing the sprinklers 406-408 (e.g., the water supply system has already been installed, receiving areas for each of the sprinklers 406-408 have already been cut into the ceiling, etc.), and/or that there is no available electrical hookup for installing/connecting the ceiling lights 403-405 in their designated location. In such an instance, plans for the construction project would need to be revised to install the ceiling lights 403-405 at new positions within the ceiling of the conference room 400—which may involve creating new project tasks, some examples of which may include a first new task to create new openings within the ceiling for receiving the ceiling lights 403-405, a second new task to add equipment to enable functionality of the ceiling lights 403-405 (e.g., wiring/cabling for connecting the ceiling lights 403-405 to a power source, etc.), and a third new task to repaint the ceiling, and then scheduling construction crews to perform those new tasks. Other aspects of the construction project may be impacted as well. For instance, failure to detect the clash between the ceiling lights 403-405 and the sprinklers 406-408 before commencing construction may result in additional time and costs incurred, which may in turn cause scheduling delays and/or budget overages for the construction project.

II. Automated Clash Detection Involving 2D Drawings

To help address some of the aforementioned challenges, disclosed herein is new software technology for facilitating automated clash detection analysis on electronic two-dimensional drawings that involves obtaining a set of 2D drawings for a construction project, identifying two or more drawings that each represent a given area of a construction project, aligning the two or more drawings, analyzing each drawing to identify a respective set of objects within the drawing, and identifying any object clashes between the respective sets of objects in the two or more drawings.

Figure 5:
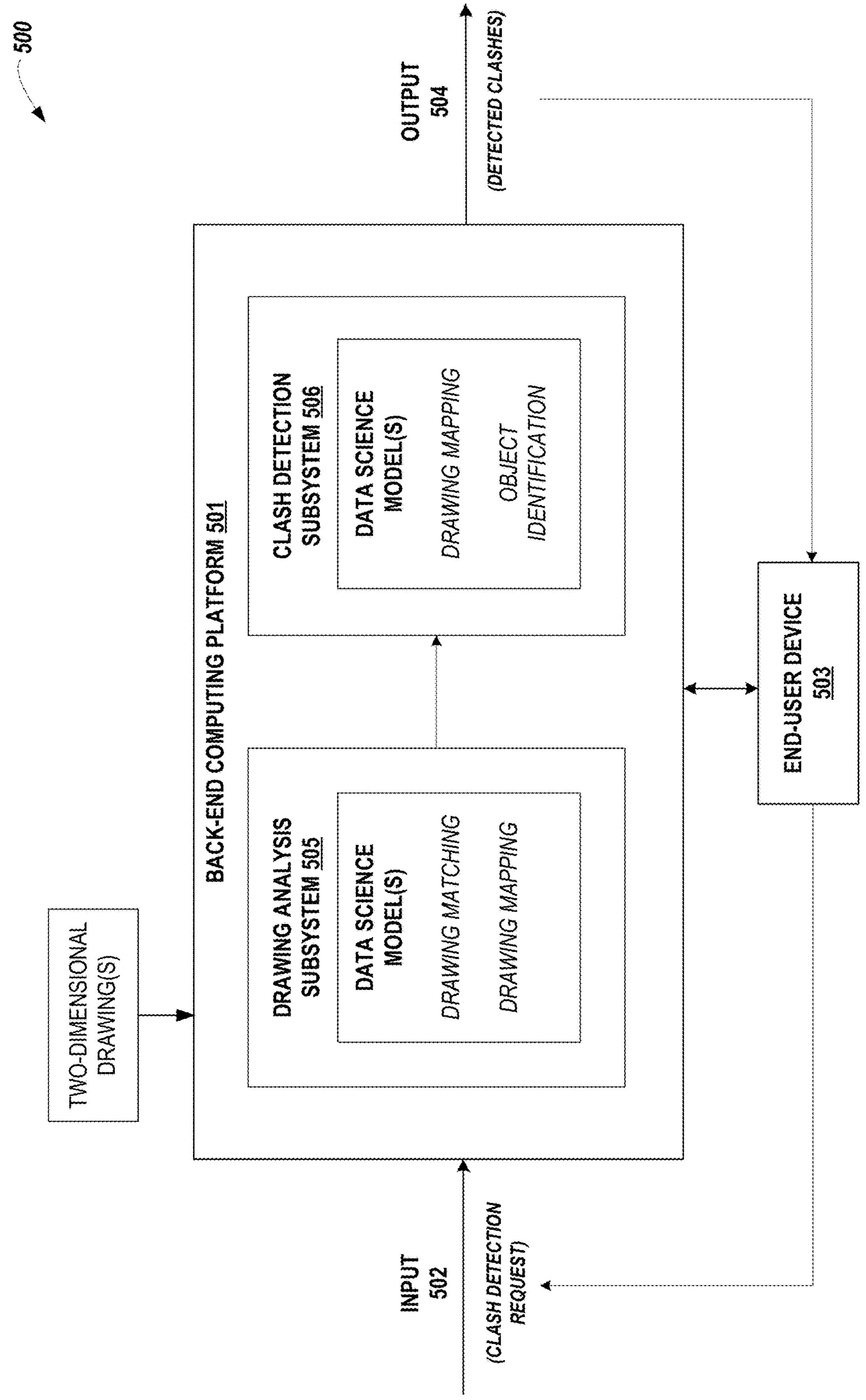
FIG. 5 depicts a structural diagram of an example computing environment in which aspects of the disclosed technology may be implemented.

Turning now to FIG. 5, an example computing environment 500 is depicted in which aspects of the disclosed technology may be implemented. The computing environment 500 may include a back-end computing platform 501 that is configured to run the software technology disclosed herein. For instance, the disclosed software technology for two-dimensional clash detection may be incorporated in a software application (e.g., mobile application, web application, etc.) that is run by the back-end computing platform 501. In some implementations, the back-end computing platform 501 may resemble or be the same as the back-end computing platform 101 of FIG. 1 or the back-end computing platform 200 of FIG. 2.

The back-end computing platform 501 may comprise various software subsystems that are responsible for carrying out functionality including one or more of the functions disclosed herein. Such software subsystems may take various forms. For instance, as shown in FIG. 5, the back-end computing platform 501 may comprise a "drawing analysis" subsystem 505 and a "clash detection" subsystem 506. Each of these subsystems and their respective functionalities will be discussed in more detail further below with reference to FIG. 6. The back-end computing platform 501 may further comprise one or more other software subsystems not shown in FIG. 5, such as a 2D cross-sectioning software subsystem that is configured to generate 2D views from 3D models of construction projects, a 3D software subsystem that is configured to generate 3D models of construction projects, and a project data software subsystem that is configured to ingest and process data for construction projects, among many other examples. Further, although not shown in FIG. 5, the back-end computing platform 501 may comprise one or more data stores that are configured to store data for construction projects.

The computing environment 500 may further comprise at least one end-user device 503 that is configured to communicate with the back-end computing platform 501. In some implementations, the end-user device 503 may resemble or be the same as one of the end-user devices 103 of FIG. 1 or the end-user device 300 of FIG. 3. Further, in some implementations, the end-user device 503 may be configured to perform one or more of the functionalities disclosed herein.

For instance, the end-user device 503 may be configured to receive user input indicating a clash detection request and provide an indication of the clash detection request to the back-end computing platform 501. The indication of the clash detection request may serve as an input 502 for initiating an automated clash detection analysis on 2D drawings as disclosed herein. In turn, the back-end computing platform 501 may cause the end-user device 503 to present one or more interface views that enable a user to provide information for the automated clash detection analysis, based on which the back-end computing platform 501 may initiate the automated clash detection analysis and thereby identify one or more clashes within the 2D drawings, which in turn may form the output 504. The output 504 may be provided at least to the end-user device 503, which may present a respective visual representation of each identified clash.

The visual representation of each identified clash may be selectable for further information and/or action. For instance, the end-user device 503 may receive user input indicating selection of a given clash that was identified by the back-end computing platform 501 and presented at the end-user device 503 and may then provide an indication of the given clash to the back-end computing platform 501, based on which the back-end computing platform may cause the end-user device 503 to display one or more interface views enabling a user to view information about the given clash and/or perform one or more actions related to the given clash (e.g., facilitate resolution of the given clash, tag the given clash for review, share the given clash with another user, view the given clash in a 3D model of the construction project, view the given clash in a 2D cross-sectional view, etc.), as will be described in more detail further below.

Figure 6:
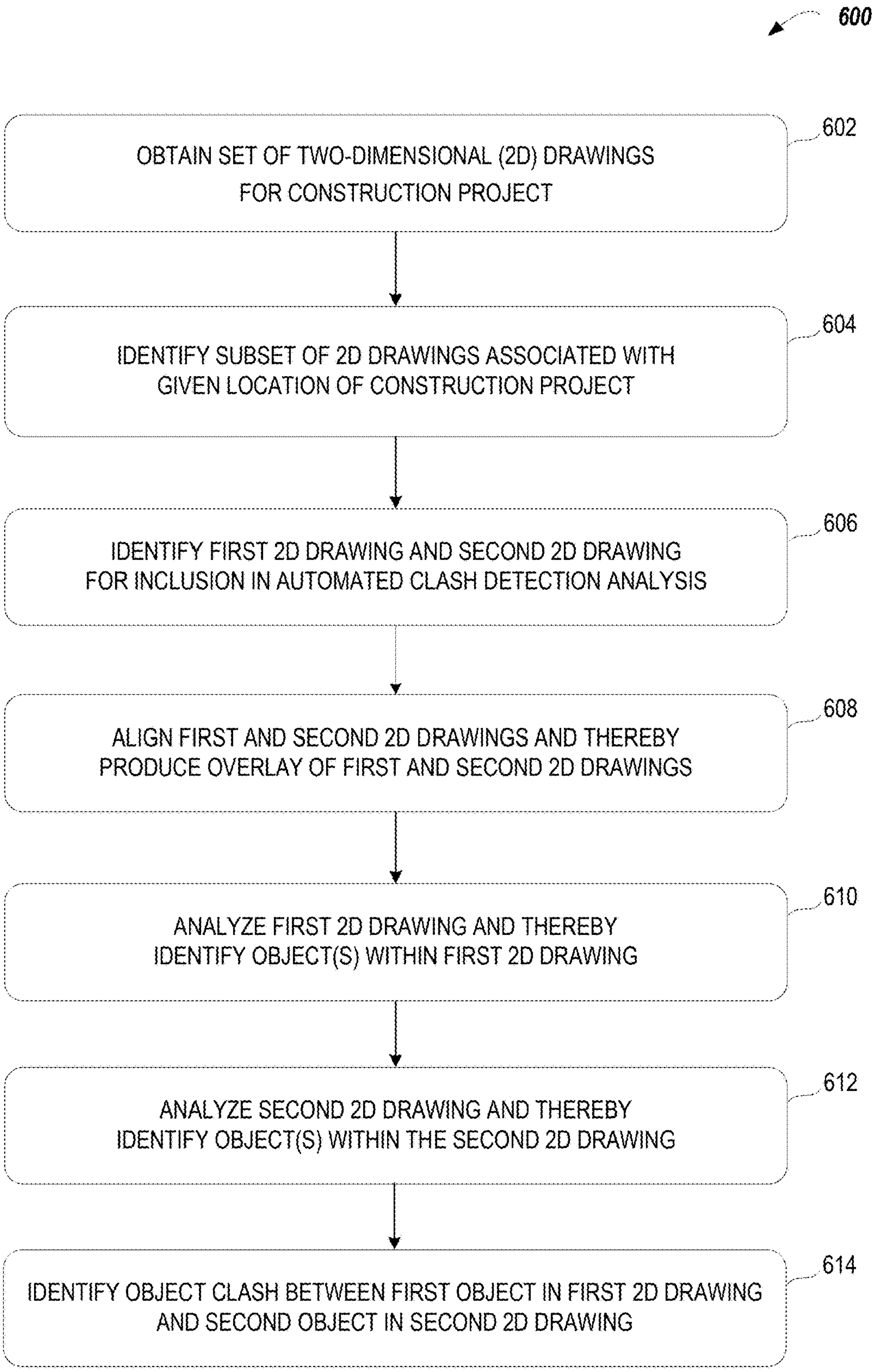
FIG. 6 depicts a flow diagram of example functionality that may be carried out for facilitating automated clash detection analysis on two-dimensional drawings, in accordance with one embodiment of the disclosed technology.

Turning now to FIG. 6, a flow diagram is shown that depicts one example 600 of functionality that may be carried out for facilitating automated clash detection analysis on 2D drawings, in accordance with one embodiment of the disclosed technology. For purposes of discussion, in the examples below, the disclosed functionality may be described as being carried out in the context of the computing environment 500 discussed above with reference to FIG. 5 (e.g., by one or more of the computing devices shown in FIG. 5, such as the back-end computing platform 501 or the end-user device 503), but it should be understood that any of the functionality disclosed herein may be carried out by any back-end computing platform that is configured to run the disclosed technology, any end-user device that is configured to communicate with a back-end computing platform that is configured to run the disclosed technology, and/or shared between any back-end computing platform that is configured to run the disclosed technology and any end-user device that is configured to communicate with a back-end computing platform that is configured to run the disclosed technology.

The example functionality 600 may begin at block 602, where the back-end computing platform 501 may obtain a set of 2D drawings associated with a construction project. In line with the discussion above, the 2D drawings obtained by the back-end computing platform 501 may span various disciplines and may include various types of information that serve to guide construction professionals during the construction process. As one example, the 2D drawings may comprise architectural drawings that include design information about the construction project, such as site plans, floor plans, reflected ceiling plans, and/or building elevation plans, among other possibilities. As another example, the 2D drawings may comprise structural drawings that depict structural details and instructions for building the construction project. As yet another example, the 2D drawings may comprise mechanical, electrical, and plumbing (MEP) drawings that depict information related to the respective mechanical, electrical, and plumbing systems for the construction project. As a further example, the 2D drawings may comprise fire safety plans that depict information related to fire safety, such as a fire mitigation system (e.g., sprinklers, alarms, control panels, fire extinguishers, etc.) and fire escape plans (e.g., exit routes, fire escapes, etc.). Other examples of 2D drawings are also possible. Furthermore, the 2D drawings obtained by the back-end computing platform 501 may take various computerized forms, including image file types or document file types, among other possibilities.

The function of obtaining the set of 2D drawings may take various forms. As one possibility, obtaining the 2D drawing(s) may comprise retrieving an electronic version of each 2D drawing from one or more data stores accessible to the back-end computing platform 501. As another possibility, obtaining the 2D drawing(s) may comprise importing an electronic version of each 2D drawing from an external source, such as a third-party computing platform. In practice, the electronic version of each 2D drawing that is obtained may be formatted as a 2D image file. In this regard, the 2D image file corresponding to each 2D drawing may be a raster image (e.g., a raster Portable Document Format (PDF) file, etc.) that is composed of an arrangement of individual pixels and thus susceptible to loss of fidelity when manipulated. Therefore, obtaining the 2D drawing(s) may further comprise converting the raster image file of each 2D drawing to a vector image file (e.g., a vector PDF, a vector Portable Network Graphics (PNG) file, etc.) that is composed of a set of instructions that detail the arrangement of points, lines, and curves in the 2D image, thereby reducing fidelity loss when the 2D drawing is displayed.

Further, the function of obtaining the set of 2D drawings may occur at various times. As one possibility, the back-end computing platform 501 may obtain an initial set of 2D drawings for a construction project. Thereafter, the back-end computing platform 501 may monitor for newly available 2D drawings and upon detecting that a new 2D drawing is accessible, obtain the new 2D drawing and add it to the set of 2D drawings. For instance, in an implementation where obtaining an electronic version of a 2D drawing comprises obtaining the 2D drawing from a data store accessible to the back-end computing platform 501, the electronic version may have been provided to the back-end computing platform 501 during an intake process whereby a construction professional (e.g., an architect, an engineer, etc.) associated with the given construction project may have accessed the back-end computing platform 501 via an end-user device (such as an end-user device 103 of FIG. 1, the end-user device 300 of FIG. 3, or the end-user device 503 of FIG. 5)

and uploaded the electronic version of the 2D drawing to be stored in the data store accessible to the back-end computing platform 501. In such instances, the back-end computing platform 501 may detect that one or more new 2D drawings are available and may accordingly automatically obtain those 2D drawings. As another possibility, the back-end computing platform 501 may obtain the set of 2D drawings in response to receiving an indication of a request to initiate an automated clash detection analysis. Other examples are also possible.

In practice, the back-end computing platform 501 may analyze each 2D drawing for the construction project to identify features of the 2D drawing based on which the back-end computing platform 501 may derive information about the 2D drawing. For instance, features of a 2D drawings may be used to derive information (e.g., location information, discipline information, etc.) that can be used to identify two or more 2D drawings that correspond to a given location (which may also be referred to herein as "drawing matching"). Further, features of a 2D drawings may be used to derive information that can be used to align two or more 2D drawings corresponding to a given location (which may also be referred to herein as "drawing mapping") in order to obtain an overlaid view for performing a clash detection analysis. More details about such features that can be used for drawing matching and drawing mapping will be explained below. In the following examples, one or more aspects of the functionality for identifying features of 2D drawings may be described as being carried out by the back-end computing platform 501. However, it should be understood that depending on the implementation, this functionality may be carried out by one or more particular subsystems of the back-end computing platform 501, such as the drawing analysis subsystem 505 shown in FIG. 5 which may comprise one or more data science models that are configured to perform functions related to identifying features within and deriving information from 2D drawings as discussed herein, or by any end-user device that is configured to communicate with the back-end computing platform 501, or shared between the back-end computing platform 501 and any end-user device that is configured to communicate with the back-end computing platform 501, among other possibilities.

The types of features that may be identified by the back-end computing platform 501 based on analyzing each 2D drawing may take various forms. For instance, as one possibility, the back-end computing platform 501 may identify one or more "textual" features within a 2D drawing to derive information about the 2D drawing. A textual feature may comprise text that is included in any titles, labels, legends, keys, text boxes, notes, or comments, among other possibilities, which are present within a 2D drawing. In this respect, the textual features that can be analyzed to derive information about a 2D drawing may be identified in various in various ways.

For instance, as one example, the back-end computing platform 501 may apply one or more Optical Character Recognition (OCR) techniques to identify textual features such as text, words, and/or phrases within a 2D drawing, which can then be used to derive information such as a discipline and/or a location associated with the 2D drawing. For example, back-end computing platform 501 may identify a title of a given 2D drawing stating "Reflected Ceiling Plan" as indicative of an architectural drawing and may thus determine that the given 2D drawing is to be associated with a discipline comprising architectural drawings for the construction project. As another example, the back-end computing platform 501 may identify a label within a given 2D drawing that states "First Floor" as indicative of a first floor of a construction project and determine that the given 2D drawing is to be associated with the first floor of the construction project. Many other examples exist.

As another example, the back-end computing platform 501 may apply one or more natural language processing (NLP) techniques to recognize textual features such as words, phrases, labels, dimensioning information, and/or other semantic information within a 2D drawing, which can then be used to derive information such as a discipline and/or a location associated with the 2D drawing. For instance, the back-end computing platform 501 may identify the words "women," "stair," or "cafe" and determine that they are indicative of a restroom, a stairway, and a cafeteria, respectively. Other examples are also possible.

The functionality of identifying textual features as described above may also involve identifying text that is not relevant to or indicative of discipline or location information for a 2D drawing. For example, the back-end computing platform 501 may determine that textual features such as a calendar date or a name of a construction professional associated with a drawing are not indicative of discipline or location information and may exclude such information from the information that is derived for the 2D drawing.

As another possibility of a type of feature that may be identified based on analyzing each 2D drawing, the back-end computing platform 501 may identify "visual" features to derive information about a 2D drawing. In this respect, visual features may generally comprise "global" features (e.g., features that indicate generalized information about areas, shapes, rooms, etc. within a 2D drawing) or "local" features (e.g., features that indicate specific information about pixels within a 2D drawing). Each of these types of features will be explained in more detail below.

Global features within a 2D drawing, which may include objects such as rooms, fixtures, hallways, staircases, among other possibilities, that can be analyzed to derive information about a 2D drawing may be identified in various ways. In this respect, as one example, the back-end computing platform 501 may apply one or more image processing techniques that are implemented using machine-learning (or data science) models that utilize neural networks (e.g., convolution neural networks, deep neural networks, etc.) to perform layered feature visualization on the pixels within a 2D drawing to identify details and characteristics of the 2D drawing, which may be output as a set of numerical properties that describe the 2D drawing. Based on the output, "key points" for each 2D drawing that represent distinctive visual features of the 2D drawing, such as corners, intersections, edges, textures, or objects, among other possibilities, may be identified. These key points may be used for various purposes as disclosed herein.

For instance, as one possibility, respective key points for two or more 2D drawings may be compared in order to determine whether or not the two or more 2D drawings "match" (e.g., correspond to a same given location). For example, a first set of key points associated with a first 2D drawing and a second set of key points associated with a second 2D drawing may be compared, and if the similarity between the first and second sets of key points falls within a certain threshold, the first and second 2D drawings may be determined to correspond to the same location. As another possibility, respective key points for two or more "matching" 2D drawings may be used to "map" the matching 2D drawings to each other such that the 2D drawings may be properly aligned for overlay in preparation for performing an automated clash detection analysis. For example, a first set of key points associated with a first 2D drawing corresponding with a given location and a second set of key points associated with a second 2D drawing corresponding with the given location may be used to map the first and second 2D drawings in order to scale and/or align the two drawings for clash detection. Other examples are also possible.

As another example, the back-end computing platform 501 may analyze each 2D drawing to identify "location entities" that represent defined areas of the construction project that are each associated with a particular location. More information about deriving location information for 2D drawings can be found in U.S. application Ser. No. 17/957,501, filed on Sep. 30, 2022, and titled "Computer Systems and Methods for Identifying Location Entities and Generating a Location Entity Data Taxonomy," and U.S. Pat. No. 11,410,362, issued on Aug. 9, 2022, and titled "Automatic Area Detection," the contents of each of which are herein incorporated by reference in their entirety.

The back-end computing platform 501 may identify visual features within 2D drawings in other ways as well.

At block 604, the back-end computing platform may identify, from the set of 2D drawings for the construction project, a subset of 2D drawings associated with a given location of the construction project. In practice, the function of identifying the subset of 2D drawings that depict the given portion of the construction project may be initiated based on receiving an indication of a request to perform an automated clash detection analysis. For instance, returning briefly to FIG. 5, a construction professional may use the end-user device 503 to access a software application incorporating the disclosed technology that is run by the back-end computing platform 501 in line with the discussion above. The construction professional may navigate to an interface view that enables the construction professional to select an option to initiate an automated clash detection analysis for a given construction project and provide user input defining a scope for the clash detection analysis, which may include at least a given location of the construction project for which the construction professional wishes to run the clash detection analysis. In turn, the end-user device 503 may transmit a data communication to the back-end computing platform 501 comprising (i) a request on behalf of the user to initiate the clash detection analysis and (ii) the defined scope, which may collectively form the input 502.

In response to receiving the input 502, the back-end computing platform 501 may identify a subset of 2D drawings from the set of 2D drawings obtained at block 602 that are associated with the given location of the construction project. For example, in line with the discussion above, the back-end computing platform 501 may identify the subset of 2D drawings associated with the given location based on performing one or more image processing techniques on each 2D drawing in the set of 2D drawings to identify respective textual and visual features for each drawing and then compare the respective textual and visual features of the 2D drawings in the set to identify each 2D drawing that is associated with the given location. In this respect, each comparison between the respective textual and visual features for a given pair of 2D drawings may yield a score (e.g., between 0 and 1) indicating a confidence level of the comparison, and the back-end computing platform 501 may determine that a comparison score for a pair of 2D drawing that falls within a certain threshold indicates that the pair of 2D drawings correspond to the same location, whereas a comparison score that does not meet the certain threshold indicates that the pair of 2D drawings do not correspond to the same location.

The back-end computing platform may then transmit a data communication to the end-user device 503 comprising information about the subset of 2D drawings. In turn, the end-user device 503 may present the subset of 2D drawings via one or more user interface views.

At block 606, the back-end computing platform 501 may identify, from the subset of 2D drawings, at least a first 2D drawing and a second 2D drawing that are to be included in the automated clash detection analysis. The function of identifying the first and second 2D drawings that are to be included in the automated clash detection analysis may take various forms.

In one implementation, after identifying the subset of 2D drawings, the back-end computing platform 501 may cause the end-user device 503 to present the subset of 2D drawings in a manner that enables the construction professional to select two or more 2D drawings for inclusion in the automated clash detection analysis. For instance, as one possibility, the subset of 2D drawings may be presented in the form of a listing comprising a respective selectable representation of each drawing in the subset of 2D drawings. As another possibility, the subset of 2D drawings may be presented in the form of a drop-down menu comprising a respective selectable representation of each drawing in the subset of 2D drawings. As yet another possibility, the subset of 2D drawings may be presented in the form of thumbnails each comprising a respective selectable representation of a given drawing in the subset of 2D drawings.

Further, in addition to the selectable representations of the subset of 2D drawings, the end-user device 503 may display discipline information for the subset of 2D drawings, which may take various forms. For instance, as one possibility, the selectable representations of the 2D drawings may indicate respective disciplines for the 2D drawings. As another possibility, the selectable representations of the 2D drawings may be categorized according to discipline. Other examples are also possible.

In turn, the construction professional may provide user input selecting two or more 2D drawings that are to be included in the automated clash detection analysis. For instance, the construction professional may select the first 2D drawing, which may correspond to a first discipline (e.g., architectural drawings), and the second 2D drawing, which may correspond to a second discipline (e.g., fire safety drawings). Based on the selection, the end-user device 503 may transmit a data communication to the back-end computing platform 501 indicating the construction professional's selection of the first and second 2D drawings that are to be included in the automated clash detection analysis.

In another implementation, after identifying the subset of 2D drawings, the back-end computing platform 501 may identify two or more 2D drawings that are to be recommended for inclusion in the automated clash detection analysis and cause the end-user device 503 to display a recommendation of the identified 2D drawings. The back-end computing platform 501 may identify 2D drawings for recommendation in various ways. For instance, as one example, the back-end computing platform 501 may identify the 2D drawings for recommendation based on historical selections of 2D drawings for automated clash detection analysis. Other examples are also possible.

In yet another implementation, the back-end computing platform 501 may automatically select two or more 2D drawings for inclusion in the automated clash detection analysis. For instance, after identifying the subset of 2D drawings, the back-end computing platform 501 may automatically identify, from each of two or more disciplines, a respective 2D drawing corresponding to the given location that is to be included in the automated clash detection analysis. For example, the back-end computing platform 501 may determine that the subset of 2D drawings comprises the first 2D drawing from the first discipline and the second 2D drawing from the second discipline and may automatically determine that both of the first and second 2D drawings should be included in the automated clash detection analysis. Thus, the back-end computing platform 501 may identify both the first and second 2D drawings for inclusion in the automated clash detection analysis.

The back-end computing platform 501 may identify the first and second 2D drawings in other ways as well.

At block 608, the back-end computing platform 501 may overlay the first and second 2D drawings for performing the automated clash detection analysis. In this respect, the 2D drawings that have been selected for inclusion in the automated clash detection analysis may be overlaid such that the orientation and scale of the 2D drawings are in alignment. The function of overlaying two or more 2D drawings may take various forms. As one possibility, overlaying the first and second 2D drawings may involve identifying a set of key points for each 2D drawing in line with the discussion above and then using the respective sets of key points to map the first and second 2D drawings to each other, which may involve assigning respective coordinate pairs corresponding to each respective set of key points, and then generating a transformation matrix that maps the coordinate in each respective coordinate pair for the first 2D drawing to the corresponding coordinate in the respective coordinate pair for the second 2D drawing. Based on the corresponding coordinate pairs for the respective sets of key points, the back-end computing platform 501 may align the two 2D drawings, making any necessary adjustments in orientation and/or scale, and thereby producing an overlay (e.g., a layered representation) of the first and second 2D drawings.

The back-end computing platform 501 may then analyze each respective 2D drawing to identify individual objects within the respective 2D drawing. While the functionality of analyzing each 2D drawing to identify individual object(s) within the 2D drawing is described below as being carried out by the back-end computing platform 501, it should be understood that such functionality may be carried out by one or more subsystems of the back-end computing platform 501, such as the clash detection subsystem 506 shown in FIG. 5 which may comprise one or more data science models that are configured to perform functions related to identifying individual objects within 2D drawings and detecting object clashes between the 2D drawings as discussed below, or by an end-user device that is configured to communicate with the back-end computing platform 501, or shared between the back-end computing platform 501 and an end-user device that is configured to communicate with the back-end computing platform 501.

The function of analyzing each respective 2D drawing to identify individual objects within the respective 2D drawing may take various forms. In this respect, the back-end computing platform 501 may utilize one or more image processing techniques and/or object detection techniques, including any of the techniques discussed above, to identify individual objects within each respective 2D drawing, such as a wall, a ceiling, a light fixture, a sprinkler, a light switch, an electrical outlet, a pipe, or a vent, among many other possibilities. The back-end computing platform 501 may then assign each individual object a respective set of coordinates. The techniques that may be utilized to identify individual objects within a respective 2D drawing may take various forms.

As one possibility, the back-end computing platform 501 may apply one or more image segmentation techniques that are implemented using machine-learning (or data science) models that utilize convolutional neural networks (CNNs), such as one or more semantic segmentation models (e.g., ResNet, DeepLab, etc.) whereby each pixel in the 2D drawing is assigned a class label (e.g., room, wall, pipe, duct, etc.), and then apply one or more post-processing steps to subdivide the overall set of commonly-classified pixels into individual objects that may be each represented by a respective 2D polygon associated with a corresponding confidence score (e.g., a number between 0 and 1) that represents the confidence level associated with the detection of the individual object. As another possible image segmentation technique, the back-end computing platform 501 may apply one or more instance segmentation models (e.g., MaskRCNN, etc.) whereby the pixels in the 2D drawing are segregated into separate regions based on the boundaries between areas in the 2D drawing, without regard to any particular class label, to produce a set of 2D polygons, each with an associated confidence score that again represents the confidence level associated with the detection of the particular object by the model. The back-end computing platform 501 may apply instance segmentation in other manners as well. Other image segmentation techniques that are based on one or more machine-learning (or data science) models are also possible.

As another possibility, the back-end computing platform 501 may apply image processing techniques that do not rely on machine-learning models (e.g., unsupervised image processing models) and instead apply rules-based algorithms that look for certain features and/or characteristics within a 2D drawing. For example, pixels within the 2D drawing that are adjacent to each other and similarly-colored (e.g., black or white), within defined tolerances, may be added as part of the same object. Other unsupervised techniques may also be used to search for particular features in a 2D drawing. The output of the unsupervised image processing techniques may be a set of 2D polygons representing the detected objects in the 2D drawing. Various other types of unsupervised image processing techniques are also possible.

It will be appreciated that an image processing technique, such as any of the techniques discussed above, if implemented in isolation, might not be reliable as a generalized solution for detecting objects across all types of construction drawings, which may include a wide range of scenarios and design layouts as previously mentioned. Therefore, the back-end computing platform 501 may use two or more different image processing techniques and then fuse the outputs of the different techniques together to produce a merged output that is more accurate and reliable than an individual output produced by a single image processing technique.

The function of fusing outputs from the different image processing techniques may take various forms. As one possibility, fusing the outputs from the different image processing techniques may comprise running a data fusion model that receives the output from each of the techniques discussed above, which may include a respective set of 2D polygons, with each polygon in each set having an associated confidence score, and then measuring the degree of overlap, or coverage, between each polygon in each set with each other polygon in each other set. In this way, the various polygons from each set may be assigned to various polygon groups based on their degree of overlap. The data fusion model may then determine a combined confidence score for each polygon group based on the polygon(s) in the group and their respective confidence scores. Based on a confidence threshold value, the data fusion model may output a final polygon that is reported as a detected object within the 2D drawing. In some cases, a polygon in a group with the highest individual confidence score may be reported as a final polygon. Alternatively, the data fusion model may synthesize a final polygon based on the member polygons of the group. Other possibilities also exist. When the analysis is complete, the data fusion model may output a set of final polygons that represent the discrete objects within the 2D drawing.

As yet another possibility, the back-end computing platform 501 may utilize one or more object detection techniques and thereby produce a respective bounding box identifying a location of each discrete object detected within the 2D drawing. For example, as one possibility, the back-end computing platform 501 may utilize an object detection algorithm that is implemented using one or more machine-learning (or data science) models that utilize a CNN, such as a You Only Look Once (YOLO) algorithm that analyzes the 2D drawing and outputs bounding boxes and respective classification labels for each discrete object within the 2D drawing. In one embodiment, the one or more machine-learning (or data science) models may be trained using manually-labeled 2D drawings from previous construction projects. Other examples are also possible.

The back-end computing platform 501 may utilize other techniques to identify individual objects within a respective 2D drawing as well.

At block 610, the back-end computing platform 501 may analyze the first 2D drawing and thereby identify each individual object within the first 2D drawing. In line with the discussion above, identifying each individual object within the first 2D drawing may involve assigning each individual object within the first 2D drawing a respective set of first coordinates. At block 612, the back-end computing platform 501 may analyze the second 2D drawing and thereby identify each individual object within the second 2D drawing. In line with the discussion above, identifying each individual object within the second 2D drawing may involve assigning each individual object within the second 2D drawing a respective set of second coordinates.

At block 614, the back-end computing platform 501 may identify any object clashes between objects in the first 2D drawing and objects in the second 2D drawing. The functionality of identifying object clashes between the first and second drawings may take various forms. For instance, as one possibility, the back-end computing platform may provide the first and second 2D drawings as input to one or more machine-learning (or data science) models that have been trained using one or more of (i) images of 2D object clashes, (ii) historical 2D object clash data, (iii) synthetic 2D object clash data, or (iv) semantic data related to object clashes, and are configured to (1) receive, as input, an overlay of two or more 2D drawings associated with a given location of a construction project and respective coordinate information for the respective individual objects identified within each 2D drawing, and (2) analyze the overlaid 2D drawings to identify any object clashes between the overlaid drawings.

Analyzing the overlaid 2D drawings to identify object clashes between the overlaid drawings may take various forms. As one possibility, analyzing the overlaid 2D drawings to identify object clashes may involve mapping a first set of coordinate information corresponding to locations of individual objects within a first 2D drawing to a second set of coordinate information corresponding to locations of individual objects within a second 2D drawing, determining any overlapping coordinate information between the first and second sets of coordinate information, and identifying a clash between each pair of objects that have overlapping coordinate information.

As another possibility, analyzing the overlaid 2D drawings to identify object clashes may involve mapping a first set of coordinate information corresponding to locations of individual objects within a first 2D drawing to a second set of coordinate information corresponding to locations of individual objects within a second 2D drawing, determining any overlapping coordinate information between the first and second sets of coordinate information, capturing a 2D image of each pair of objects that have overlapping coordinate information, comparing respective image data of each 2D image with image data of known 2D object clashes to determine whether or not the 2D image indicates an object clash, and identifying a clash between objects within each 2D image that was determined to indicate an object clash.

As yet another possibility, analyzing the overlaid 2D drawings to identify object clashes may involve mapping a first set of coordinate information corresponding to locations of individual objects within a first 2D drawing to a second set of coordinate information corresponding to locations of individual objects within a second 2D drawing, determining any overlapping coordinate information between the first and second sets of coordinate information, comparing respective data for each object pair having overlapping coordinate information with historical object clash data to determine if overlapping coordinate information for similar object pairs was historically identified as an object clash, and identifying an object clash for each object pair that was determined to match a historical object clash.

Analyzing the overlaid 2D drawings to identify object clashes between the overlaid drawings may take various forms as well.

Further, as mentioned above, the one or more machine-learning (or data science) models may be trained using various types of training data. As one possibility, the machine-learning (or data science) models may be trained using 2D images of known object clashes. As another possibility, the machine-learning (or data science) models may be trained using historical 2D object clash data. In this respect, the historical 2D object clash data may comprise one or more of (i) data associated with previously identified object clashes for the given construction project, (ii) data associated with previously identified object clashes for other ongoing construction projects accessible to the back-end computing platform 501, or (iii) data associated with previously identified object clashes for completed construction projects accessible to the back-end computing platform 501.

As yet another possibility, the machine-learning (or data science) models may be trained using synthetic 2D object clash data. For example, in one implementation, the synthetic 2D object clash data may be created using an existing BIM file for the given construction project. For instance, the back-end computing platform 501 may use the BIM file to generate a 3D model of the construction project and then analyze the 3D model to identify 3D object clashes, more information about which can be found in U.S. patent application Ser. No. 18/334,832, filed Jun. 14, 2023, and titled “Computer Systems and Methods for Intelligent Clash Detection and Resolution,” the contents of which are incorporated by reference herein in their entirety. The back-end computing platform 501 may then create synthetic 2D object clash data by capturing a top-down view of each detected 3D clash and generating respective 2D image data and/or object clash data for each detected 3D clash. In another implementation, the synthetic 2D object clash data may be created using a synthetically created BIM file. For instance, the back-end computing platform 501 may access a synthetic BIM file that has been generated using one or more artificial intelligence models, generate a 3D model of the construction project based on the synthetic BIM file, analyze the generated 3D model to identify 3D object clashes as described above, and then create synthetic 2D object clash data by capturing a top-down view of each detected 3D clash and generating respective 2D image data and/or object clash data for each detected 3D clash. Other examples are also possible.

Further, as another possibility, the machine-learning (or data science) models may be trained using semantic data about object clashes. Indeed, not all intersections between objects need to be resolved. Rather, certain types of intersections are "permitted" and even necessary. For example, an intersection between a ceiling and another object such as a pipe or a duct or a light fixture or a sprinkler should not be identified as an object clash because those objects are intended to intersect with the ceiling during installation. Thus, the semantic data may enable the machine-learning models to determine whether or not an intersection between two or more objects truly comprises an object clash that needs to be resolved rather than a permitted intersection. In this respect, the semantic data may comprise information about permitted object clashes. Therefore, when performing the automated clash detection analysis, the back-end computing platform 501 may determine that overlapping objects between the overlaid 2D drawings that correspond to a permitted type of object clash should not be identified as an object clash in an automated clash detection analysis.

The one or more machine-learning (or data science) models may be trained using other types of training data as well.

The object clashes identified by the back-end computing platform 501 based on performing the automated clash detection analysis as described above may collectively form the output 504 shown in FIG. 5. The back-end computing platform 501 may then take one or more actions related to the output 504.

For instance, the back-end computing platform 501 may send information about one or more object clashes identified as a result of the clash detection analysis to the end-user device 503. In turn, the end-user device 503 may display a respective indication for one or more identified clashes, which may take various forms.

In one implementation, the end-user device 503 may display a user interface view that includes a layered view of the 2D drawings that were selected for inclusion in the automated clash detection analysis. The respective indication of each identified clash may take the form of a respective visual representation displayed within the layered view of the 2D drawings that may be selectable to obtain information about the clash. Further, in some implementations, the respective visual representation may be selectable to obtain information about and/or facilitate performance of one or more actions related to the clash. For instance, selecting the respective visual representation may cause options for available actions to be displayed, such as an option to resolve the clash, an option to assign the clash to a given party that is to be responsible for resolving the clash, or an option to share information about the clash, as some examples. Further yet, in some implementations, the user interface view may include an option to view a given identified clash from different perspectives, such as in a 3D model of the construction project or in a 2D cross-sectional view of the 3D model of the construction project, among other possibilities.

Figure 7A:
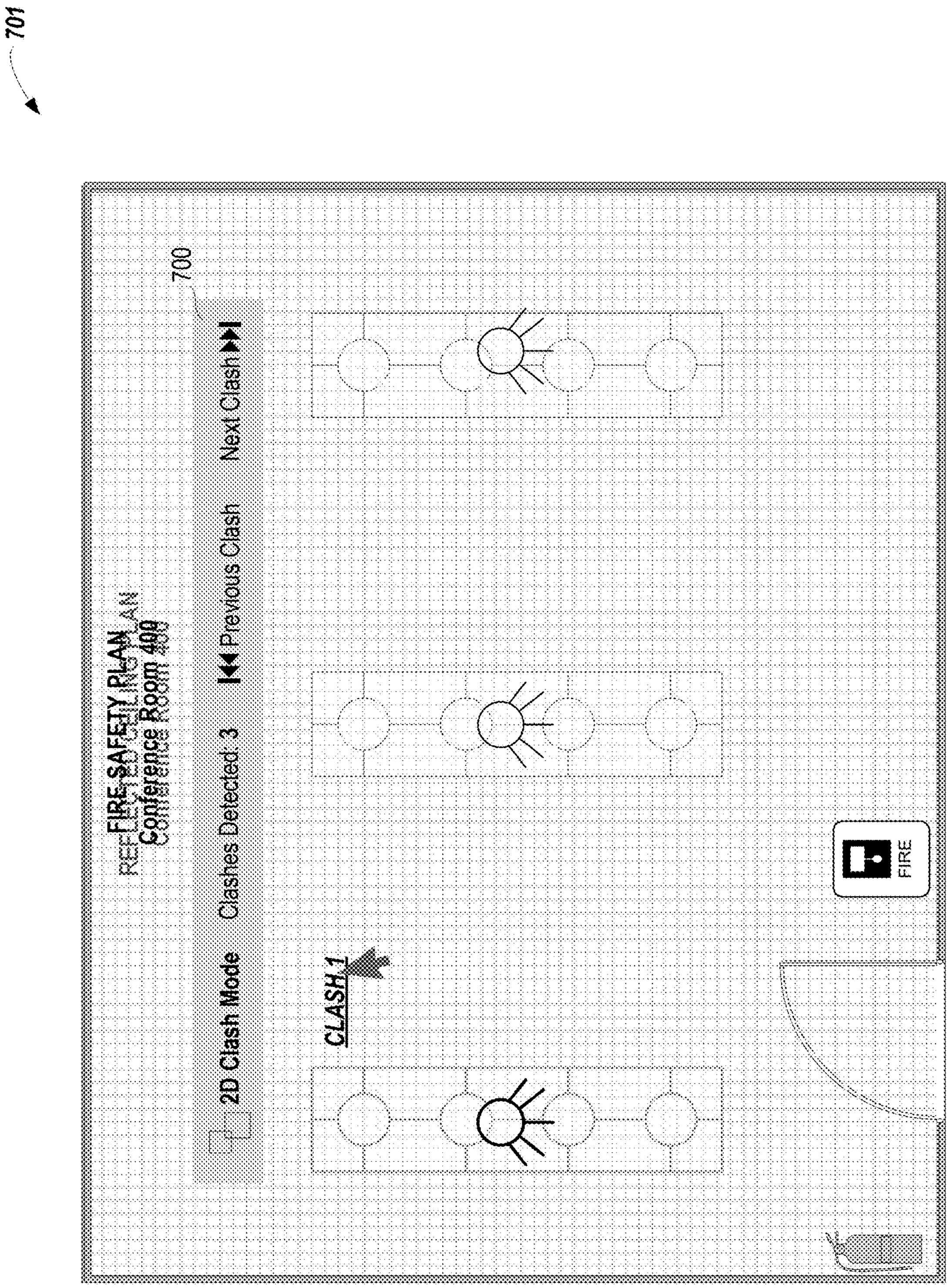
FIG. 7A depicts an example interface view that may be displayed at an end-user device to present results of an automated clash detection analysis in accordance with aspects of the disclosed technology.
Figure 7B:
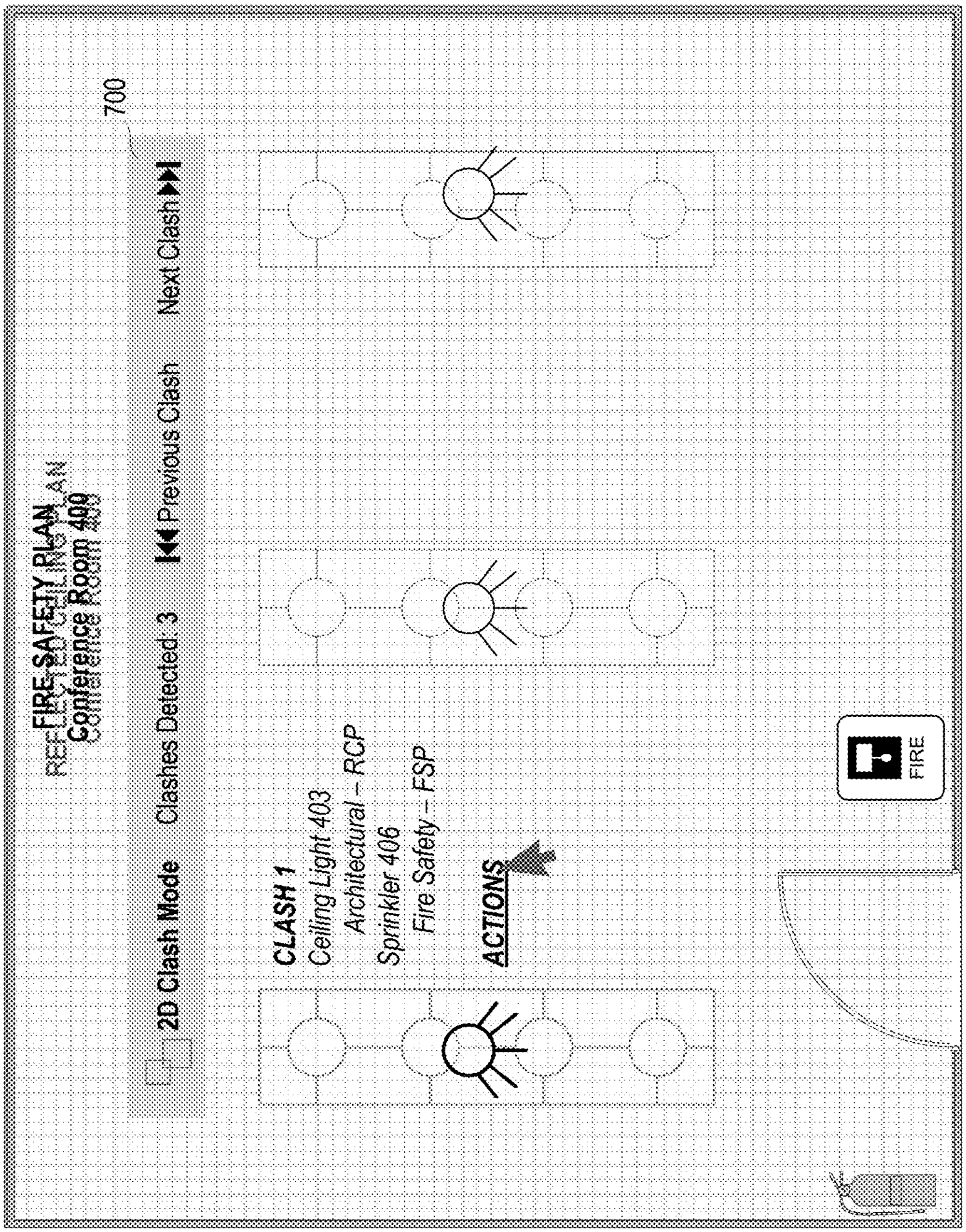
FIG. 7B depicts an example interface view that may be displayed at an end-user device to provide information regarding a given object clash in accordance with aspects of the disclosed technology.
Figure 7C:
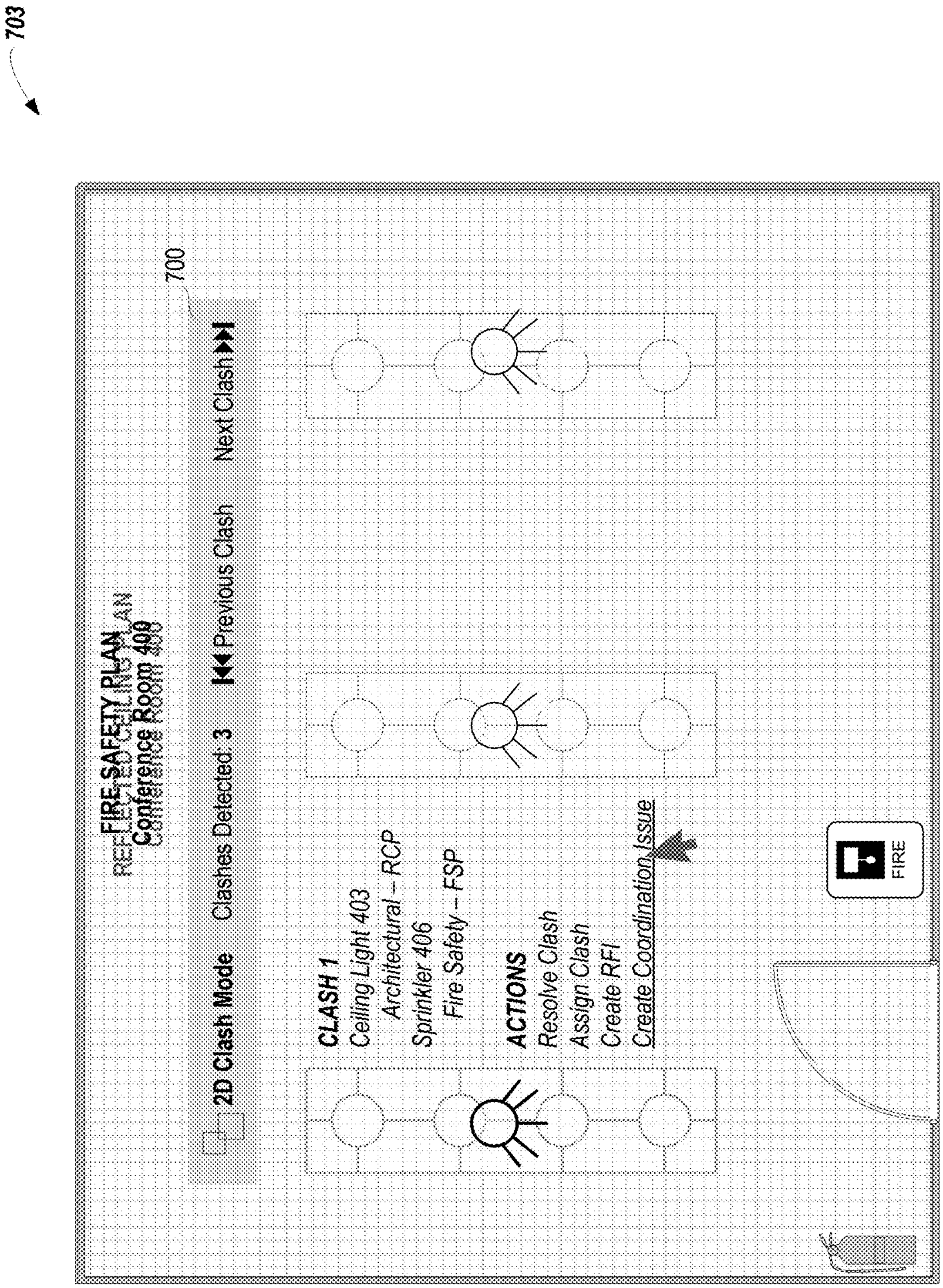
FIG. 7C depicts an example interface view that may be displayed in response at an end-user device to provide information regarding available actions that may be facilitated with respect to a given object clash in accordance with aspects of the disclosed technology.

FIGS. 7A, 7B, and 7C depict example user interface views that may be presented by an end-user device 503 based on receiving, from the back-end computing platform 501, information about results of an automated clash detection analysis between a first 2D drawing and a second 2D drawing associated with a given location of a construction project. The first 2D drawing may comprise an architectural drawing associated with the given location, such as the 2D drawing 401 associated with the Conference Room 400 shown in FIG. 4A, and the second 2D drawing may comprise a fire safety drawing associated with the given location, such as the 2D drawing 411 associated with the Conference Room 400 shown in FIG. 4B.

Turning first to FIG. 7A, one example of a view 701 that may be displayed by the end-user device 503 after receiving the results of the automated clash detection analysis from the back-end computing platform 501 is shown. As shown in FIG. 7A, the view 701 includes a layered view of portions of the first and second 2D drawings, wherein the second 2D drawing is overlaid on a transparent version of the first 2D drawing, thereby enabling visibility of objects within both 2D drawings simultaneously. A pane 700 may indicate a number of clashes that were identified during the automated clash detection analysis (e.g., "Clashes Detected: 3") and may also include selectable navigational controls that enable navigating between the respective visual representations of each clash. Further, a respective visual representation of a given clash that has been selected may be highlighted in some manner to indicate that the respective visual representation is currently selected.

For instance, in the example of FIG. 7A, when selected, the respective visual representation for a given clash identified as "Clash 1" may be updated to include a bolded outline and a corresponding label identifying the clash, thereby indicating that the given clash is currently selected. In this respect, the respective visual indication for the given clash may have been selected in various ways. For instance, as one possibility, the construction professional may have manually selected the given clash by selecting the respective visual indication of the given clash. As another possibility, the construction professional may have selected a navigation control option (e.g., "Previous Clash" or "Next Clash"), which in turn may have caused the given clash to be automatically selected (e.g., by the end-user device 503). Further, as shown, the label "Clash 1" included in the visual representation of the given clash may be selectable to display additional information related to the given clash.

FIG. 7B depicts one example of a view 702 that may be displayed in response to selection of the respective visual representation (e.g., the label) corresponding to the given clash identified as "Clash 1" in FIG. 7A. The view 702 may include additional information about the given clash, such as information about each object included in the clash (e.g., an object type, an object name, etc.), along with information about a corresponding drawing discipline associated with each object. Additionally, the view 702 may include a selectable option to view available actions that may be facilitated with respect to the given clash.

FIG. 7C depicts an example view 703 that may be displayed in response to selection of the option to view available actions that may be facilitated with respect to the given clash. For instance, the available actions may include options to (i) "Resolve Clash," selection of which may enable the construction professional to perform one or more further actions to facilitate resolution of the given clash, (ii) "Assign Clash," selection of which may enable the construction professional to assign the clash to one or more other parties who may be responsible for resolving the clash, (iii) "Create RFI," selection of which may enable the construction professional to create a new RFI (Request for Information) that may be required in order to resolve the given clash, and (iv) "Create Coordination Issue," selection of which may enable the construction professional to create a new coordination issue for facilitating coordination between various parties that are to be involved with resolution of the given clash. More information about mitigating conflicts using coordination issues can be found in U.S. Pat. No. 10,963,598, filed Feb. 14, 2019, and titled "Computer System and Method for Managing Coordination Issues in Construction Projects," the contents of which are hereby incorporated by reference in their entirety.

It should be understood that the views 701-703 discussed above with reference to FIG. 7A-7C illustrate some examples of the manner in which results of an automated clash detection analysis may be presented to a user in accordance with one implementation. In other implementations, results of an automated clash detection analysis may be presented in other ways and may include additional (or less) information not shown in FIGS. 7A-7C.

Further, in practice, the back-end computing platform 501 and/or the end-user device 503 may perform additional functionality related to a given clash based on user input received via a user interface view.

For instance, as one possibility, based on selection of an action option to assign a given clash, the back-end computing platform 501 may determine additional information for facilitating assignment of the given clash to one or more other users. For instance, based on historical data and/or construction project data, the back-end computing platform 501 may determine a party that is likely to be responsible for resolving the given clash and cause the end-user device 503 to display one or more interface views that enable a construction professional to assign the given clash to the party for resolution. In this respect, the back-end computing platform 501 may also cause the end-user device 503 to pre-populate the one or more interface views with at least a portion of the determined additional information. For instance, the back-end computing platform 501 may cause the end-user device 503 to pre-populate the one or more interface views with information identifying the determined party that is likely to be responsible for resolving the given clash. Further, based on an indication that the construction professional has provided user input assigning the given clash to the party, the back-end computing platform 501 may perform further functions such as generating a notification for transmittal to the party, and/or causing an end-user device associated with the party to display the notification, among other possibilities.

As another possibility, based on selection of an action option to create a new data object related to a given clash, such as a new RFI, the back-end computing platform 501 may determine additional information that may be required for creating the RFI (e.g., a title, a description, information about the given clash, a party responsible for completing the RFI, etc.) and cause the end-user device 503 to display one or more interface views for creating the RFI that are pre-populated with at least a portion of the determined additional information. Further, based on an indication that the construction professional has provided user input defining the new RFI the back-end computing platform 501 may perform further functions such as storing data defining the RFI, generating a notification for transmittal to the party responsible for completing the RFI, and/or causing an end-user device associated with the party to display the notification, among other possibilities. More information about automatically generating RFIs and other data objects can be found in U.S. patent application Ser. No. 18/481,060, filed Oct. 4, 2023, and titled "Automatic Content Generator for Construction-Based Data Objects," the contents of which are hereby incorporated by reference in their entirety.

As yet another possibility, based on selection of an action option to create a new Coordination Issue related to a given clash, the back-end computing platform 501 may determine additional information that may be required for creating the Coordination Issue (e.g., a title, a description, information about the given clash, parties that are to be involved in coordinating resolution of the given clash, etc.) and cause the end-user device 503 to display one or more interface views for creating the Coordination Issue that are pre-populated with at least a portion of the determined additional information. Further, based on an indication that the construction professional has provided user input defining the new Coordination Issue, the back-end computing platform 501 may perform further functions such as storing data defining the Coordination Issue and generating a notification for transmittal to each party that is involved in coordinating resolution of the given clash, among other possibilities.

The back-end computing platform 501 and/or the end-user device 503 may perform other functionality based on user input received via a user interface view with respect to a given clash as well.

CONCLUSION

Example embodiments of the disclosed innovations have been described above. Those skilled in the art will understand, however, that changes and modifications may be made to the embodiments described without departing from the true scope and spirit of the present invention, which will be defined by the claims.

Further, to the extent that examples described herein involve operations performed or initiated by actors, such as "humans," "operators," "users," or other entities, this is for purposes of example and explanation only. Claims should not be construed as requiring action by such actors unless explicitly recited in claim language.

The invention claimed is:

1. A computing platform comprising:
at least one processor;
at least one non-transitory computer-readable medium; and
program instructions stored on the at least one non-transitory computer-readable medium that are executable by the at least one processor such that the computing platform is configured to:
obtain a set of two-dimensional (2D) drawings for a construction project;
from the set of 2D drawings, identify a subset of 2D drawings that are associated with a given location of the construction project;
identify a first 2D drawing and a second 2D drawing from the subset of 2D drawings for inclusion in an automated clash detection analysis;
based on comparing a first set of key points for the first 2D drawing and a second set of key points for the second 2D drawing, align the first and second 2D drawings and thereby produce an overlay of the first and second 2D drawings;

analyze the first 2D drawing to (i) identify a first set of distinct objects depicted in the first 2D drawing and (ii) semantically classify the first set of distinct objects in accordance with a predefined group of object classes;

analyze the second 2D drawing to (i) identify a second set of distinct objects depicted in the second 2D drawing and (ii) semantically classify the second set of distinct objects in accordance with the predefined group of object classes;

perform an evaluation of the first set of distinct objects as compared to the second set of distinct objects; and based on the evaluation, identify an object clash representing a design conflict between a first distinct object in the first set of distinct objects that is assigned to a first object class and a second distinct object in the second set of distinct objects that is assigned to a second object class.

2. The computing platform of claim 1, further comprising program instructions stored on the at least one non-transitory computer-readable medium that are executable by the at least one processor such that the computing platform is configured to:

receive, from an end-user device associated with a user, an indication of a request to initiate the automated clash detection analysis, wherein the request indicates the given location.

3. The computing platform of claim 1, further comprising program instructions stored on the at least one non-transitory computer-readable medium that are executable by the at least one processor such that the computing platform is configured to:

cause an end-user device to display a visual representation of the object clash representing the design conflict between the first and second distinct objects.

4. The computing platform of claim 1, wherein the program instructions that are executable by the at least one processor such that the computing platform is configured to identify the first 2D drawing and the second 2D drawing for inclusion in the automated clash detection analysis comprise program instructions that are executable by the at least one processor such that the computing platform is configured to:

cause an end-user device to display one or more user interface views including a respective indication of each 2D drawing in the subset of 2D drawings; and receive, from the end-user device, an indication that the first 2D drawing and the second 2D drawing have been selected for inclusion in the automated clash detection analysis.

5. The computing platform of claim 1, wherein the program instructions that are executable by the at least one processor such that the computing platform is configured to identify the subset of 2D drawings that are associated with the given location of the construction project comprise program instructions that are executable by the at least one processor such that the computing platform is configured to:

for each respective 2D drawing in the set of 2D drawings, perform an image processing analysis and thereby determine a respective location for the respective 2D drawing;

identify each 2D drawing that has a respective location matching the given location; and include each identified 2D drawing in the subset of 2D drawings.

6. The computing platform of claim 1, wherein the program instructions that are executable by the at least one processor such that the computing platform is configured to align the first and second 2D drawings and thereby produce the overlay of the first and second 2D drawings comprise program instructions that are executable by the at least one processor such that the computing platform is configured to:

use one or more neural network techniques to identify the first set of key points for the first 2D drawing and the second set of key points for the second 2D drawing;

generate a transformation matrix that maps the first set of key points for the first 2D drawing to the second set of key points for the second 2D drawing;

based on the transformation matrix, align the first and second 2D drawings; and layer the first and second 2D drawings and thereby produce the overlay of the first and second 2D drawings.

7. The computing platform of claim 1, wherein the program instructions that are executable by the at least one processor such that the computing platform is configured to perform the evaluation of the first set of distinct objects as compared to the second set of distinct objects comprise program instructions that are executable by the at least one processor such that the computing platform is configured to:

provide the overlay of the first and second 2D drawings and data defining the first and second sets of distinct objects as input to one or more machine-learning models that have been trained to identify object clashes representing design conflicts using data comprising one or more of (i) image data corresponding to 2D images of known object clashes, (ii) historical 2D object clash data, (iii) synthetic 2D object clash data, or (iv) semantic data about object clashes.

8. The computing platform of claim 1, wherein the first 2D drawing is associated with a first discipline of 2D drawings and the second 2D drawing is associated with a second discipline of 2D drawings that is different from the first discipline.

9. The computing platform of claim 1, wherein the design conflict comprises an unpermitted intersection between the first distinct object that is assigned to the first object class and the second distinct object that is assigned to the second object class.

10. A non-transitory computer-readable medium, wherein the non-transitory computer-readable medium is provisioned with program instructions that, when executed by at least one processor, cause a computing platform to:

obtain a set of two-dimensional (2D) drawings for a construction project;

from the set of 2D drawings, identify a subset of 2D drawings that are associated with a given location of the construction project;

identify a first 2D drawing and a second 2D drawing from the subset of 2D drawings for inclusion in an automated clash detection analysis;

based on comparing a first set of key points for the first 2D drawing and a second set of key points for the second 2D drawing, align the first and second 2D drawings and thereby produce an overlay of the first and second 2D drawings;

analyze the first 2D drawing to (i) identify a first set of distinct objects depicted in the first 2D drawing and (ii) semantically classify the first set of distinct objects in accordance with a predefined group of object classes;

analyze the second 2D drawing to (i) identify a second set of distinct objects depicted in the second 2D drawing and (ii) semantically classify the second set of distinct objects in accordance with the predefined group of object classes;

perform an evaluation of the first set of distinct objects as compared to the second set of distinct objects; and based on the evaluation, identify an object clash representing a design conflict between a first distinct object in the first set of distinct objects that is assigned to a first object class and a second distinct object in the second set of distinct objects that is assigned to a second object class.

11. The non-transitory computer-readable medium of claim 10, wherein the non-transitory computer-readable medium is also provisioned with program instructions that, when executed by the at least one processor, cause the computing platform to:

receive, from an end-user device associated with a user, an indication of a request to initiate the automated clash detection analysis, wherein the request indicates the given location.

12. The non-transitory computer-readable medium of claim 10, wherein the non-transitory computer-readable medium is also provisioned with program instructions that, when executed by the at least one processor, cause the computing platform to:

cause an end-user device to display a visual representation of the object clash representing the design conflict between the first and second distinct objects.

13. The non-transitory computer-readable medium of claim 10, wherein the program instructions that, when executed by the at least one processor, cause the computing platform to identify the first 2D drawing and the second 2D drawing for inclusion in the automated clash detection analysis comprise program instructions that, when executed by the at least one processor, cause the computing platform to:

cause an end-user device to display one or more user interface views including a respective indication of each 2D drawing in the subset of 2D drawings; and receive, from the end-user device, an indication that the first 2D drawing and the second 2D drawing have been selected for inclusion in the automated clash detection analysis.

14. The non-transitory computer-readable medium of claim 10, wherein the program instructions that, when executed by the at least one processor, cause the computing platform to identify the subset of 2D drawings that are associated with the given location of the construction project comprise program instructions that, when executed by the at least one processor, cause the computing platform to:

for each respective 2D drawing in the set of 2D drawings, perform an image processing analysis and thereby determine a respective location for the respective 2D drawing;

identify each 2D drawing that has a respective location matching the given location; and include each identified 2D drawing in the subset of 2D drawings.

15. The non-transitory computer-readable medium of claim 10, wherein the program instructions that, when executed by the at least one processor, cause the computing platform to align the first and second 2D drawings and thereby produce the overlay of the first and second 2D drawings comprise program instructions that, when executed by the at least one processor, cause the computing platform to:

use one or more neural network techniques to identify the first set of key points for the first 2D drawing and the second set of key points for the second 2D drawing;

generate a transformation matrix that maps the first set of key points for the first 2D drawing to the second set of key points for the second 2D drawing;

based on the transformation matrix, align the first and second 2D drawings; and layer the first and second 2D drawings and thereby produce the overlay of the first and second 2D drawings.

16. The non-transitory computer-readable medium of claim 10, wherein the program instructions that, when executed by the at least one processor, cause the computing platform to perform the evaluation of the first set of distinct objects as compared to the second set of distinct objects comprise program instructions that, when executed by the at least one processor, cause the computing platform to:

provide the overlay of the first and second 2D drawings and data defining the first and second sets of distinct objects as input to one or more machine-learning models that have been trained to identify object clashes representing design conflicts using data comprising one or more of (i) image data corresponding to 2D images of known object clashes, (ii) historical 2D object clash data, (iii) synthetic 2D object clash data, or (iv) semantic data about object clashes.

17. The non-transitory computer-readable medium of claim 10, wherein the first 2D drawing is associated with a first discipline of 2D drawings and the second 2D drawing is associated with a second discipline of 2D drawings that is different from the first discipline.

18. A method carried out by a computing platform, the method comprising:

obtaining a set of two-dimensional (2D) drawings for a construction project;

from the set of 2D drawings, identifying a subset of 2D drawings that are associated with a given location of the construction project;

identifying a first 2D drawing and a second 2D drawing from the subset of 2D drawings for inclusion in an automated clash detection analysis;

based on comparing a first set of key points for the first 2D drawing and a second set of key points for the second 2D drawing, aligning the first and second 2D drawings and thereby producing an overlay of the first and second 2D drawings;

analyzing the first 2D drawing to (i) identify a first set of distinct objects depicted in the first 2D drawing and (ii) semantically classify the first set of distinct objects in accordance with a predefined group of object classes;

analyzing the second 2D drawing to (i) identify a second set of distinct objects depicted in the second 2D drawing and (ii) semantically classify the second set of distinct objects in accordance with the predefined group of object classes;

performing an evaluation of the first set of distinct objects as compared to the second set of distinct objects; and based on the evaluation, identifying an object clash representing a design conflict between a first distinct object in the first set of distinct objects that is assigned to a first object class and a second distinct object in the second set of distinct objects that is assigned to a second object class.

19. The method of claim 18, further comprising:

receiving, from an end-user device associated with a user, an indication of a request to initiate the automated clash detection analysis, wherein the request indicates the given location.

20. The method of claim 18, further comprising:

causing an end-user device to display a visual representation of the object clash representing the design conflict between the first and second distinct objects.

21. The method of claim 18, wherein identifying the first 2D drawing and the second 2D drawing for inclusion in the automated clash detection analysis comprises:

causing an end-user device to display one or more user interface views including a respective indication of each 2D drawing in the subset of 2D drawings; and receiving, from the end-user device, an indication that the first 2D drawing and the second 2D drawing have been selected for inclusion in the automated clash detection analysis.

* * * * *